(12) United States Patent
Fang et al.

(10) Patent No.: US 6,278,964 B1
(45) Date of Patent: Aug. 21, 2001

(54) HOT CARRIER EFFECT SIMULATION FOR INTEGRATED CIRCUITS

(75) Inventors: Jingkun Fang, Santa Clara, CA (US); Hirokazu Yonezawa, Hyogo (JP); Lifeng Wu, Fremont, CA (US); Yoshiyuki Kawakami; Nobufusa Iwanishi, both of Osaka (JP); Alvin I-Hsien Chen, Santa Clara, CA (US); Norio Koike, Kyoto (JP); Ping Chen; Chune-Sin Yeh, both of Santa Clara, CA (US); Zhihong Liu, Sunnyvale, CA (US)

(73) Assignees: Matsushita Electric Industrial Co., Ltd., Osaka (JP); BTA Technology Inc., Santa Clara, CA (US)

( * ) Notice: Subject to any disclaimer, the term of this patent is extended or adjusted under 35 U.S.C. 154(b) by 0 days.

(21) Appl. No.: 09/087,413

(22) Filed: May 29, 1998

(51) Int. Cl.$^7$ .............................. G06F 11/26; G05B 23/02

(52) U.S. Cl. ................................ 703/19; 703/14; 714/25; 714/47

(58) Field of Search ................................. 703/14, 15, 19; 714/47, 25

(56) References Cited

U.S. PATENT DOCUMENTS

| | | | |
|---|---|---|---|
| 5,508,632 | * 4/1996 | Shimizu et al. | 324/769 |
| 5,533,197 | 7/1996 | Moran et al. | 714/55 |
| 5,615,377 | * 3/1997 | Shimizu et al. | 703/13 |
| 5,974,247 | * 10/1999 | Yonezawa | 703/19 |
| 6,024,478 | * 2/2000 | Yamamoto | 382/145 |
| 6,047,247 | * 4/2000 | Iwanishi et al. | 702/117 |

FOREIGN PATENT DOCUMENTS 10-124565 * 5/1998 (JP) .

OTHER PUBLICATIONS

Hu, C. "IC Reliability Simulation," IEEE Journal of Solid-State Circuits. vol. 27, No. 3, Mar. 1992, pp. 241–246.*

Minami, E. et al. "Prediction of Hot–Carrier Degradation in Digital CMOS VLSI by Timing Simulation," Int'l Electron Devices Meeting, Technical Digest. Dec. 1992, pp. 539–542.*

Lee, P. et al. "Circuit Aging Simulator (CAS)," Int'l Electron Devices Meeting, Technical Digest. Dec. 1988, pp. 134–137.*

Minehane, S. et al. "Direct BSIM3v3 Parameter Extraction for Hot–Carrier Reliability Simulation of N–Channel LDD MOSFETS," Proc. of 1997 6th Int'l Symp. on Physical & Failure Analysis of Integrated Circuits. Jul. 1997, pp. 133–139.*

(List continued on next page.)

Primary Examiner—Kyle J. Choi
(74) Attorney, Agent, or Firm—McDermott, Will & Emery

(57) ABSTRACT

An approach for simulating hot carrier effects in an integrated circuit (IC) at the circuit level includes generating a hot carrier library of delay data for each cell in the IC, using the hot carrier library data to generate a set of scaled timing data for the IC and using the scaled timing data with a IC performance simulator to simulate the IC operation. The scaled timing data is based upon the cell delay data and time-based switching activity of each cell in the IC.

46 Claims, 19 Drawing Sheets

OTHER PUBLICATIONS

Son, K. et al. "Dynamic Life–Estimation of CMOS ICs in Real Operating Environment: Precise Electrical Method and MLE," IEEE Trans. on Reliability. vol. 46, No. 1, Mar. 1997, pp. 31–37.*

Jiang, W. et al. "Key Hot–Carrier Degradation Model Calibration and Verification Issues for Accurate AC Circuit–Level Reliability Simulation," 35th Annual IEEE Int'l Reliability Physics Symp. Apr. 1997, pp. 300–306.*

Li, P. et al. "Computer–Aided Redesign of VLSI Circuits for Hot–Carrier Reliability," Proc. of 1993 IEEE Int'l Conf. on Computer Design: VLSI in Computers and Processors (ICCD '93). Oct. 1993, pp. 534–537.*

Berkeley Technology Associates Marketing Brochure for BTABERT, *An Integrated Solution for Circuit–Level, Hot Carrier Reliability Simulation*, 5/97.

* cited by examiner

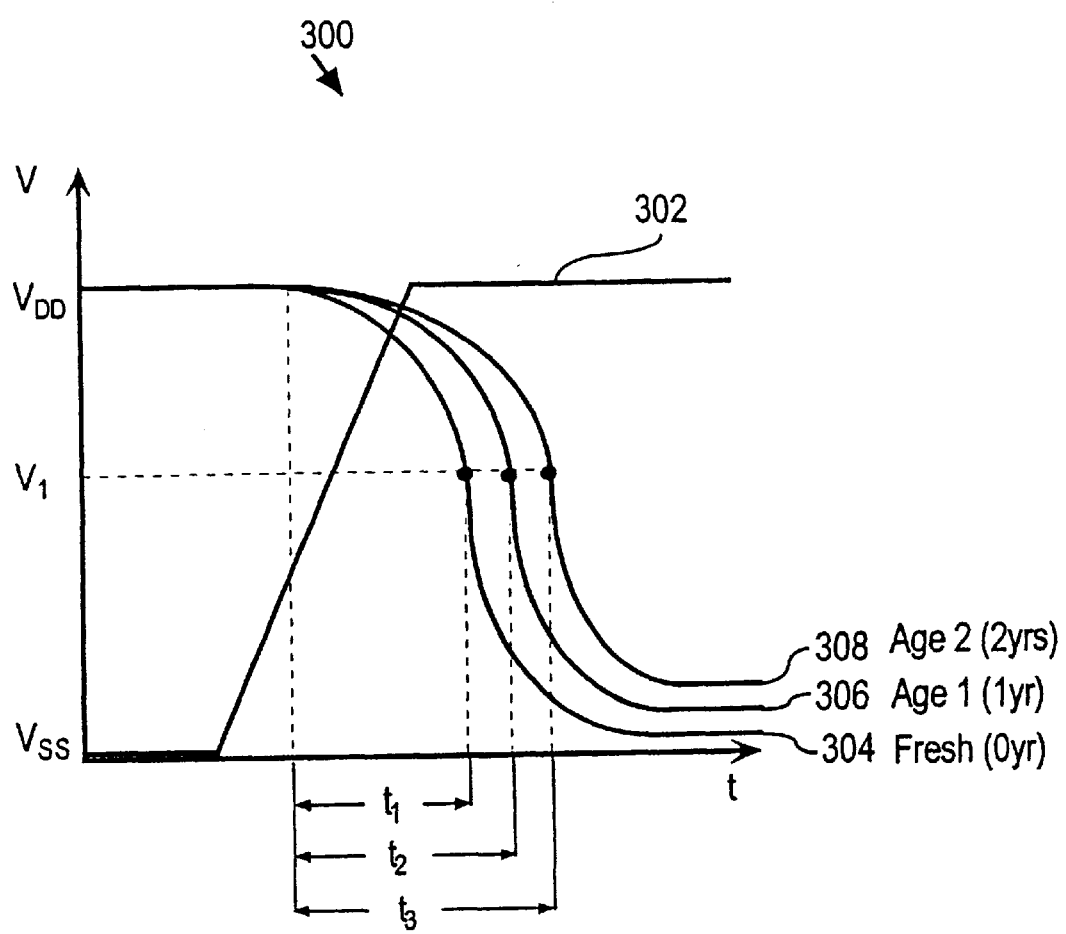

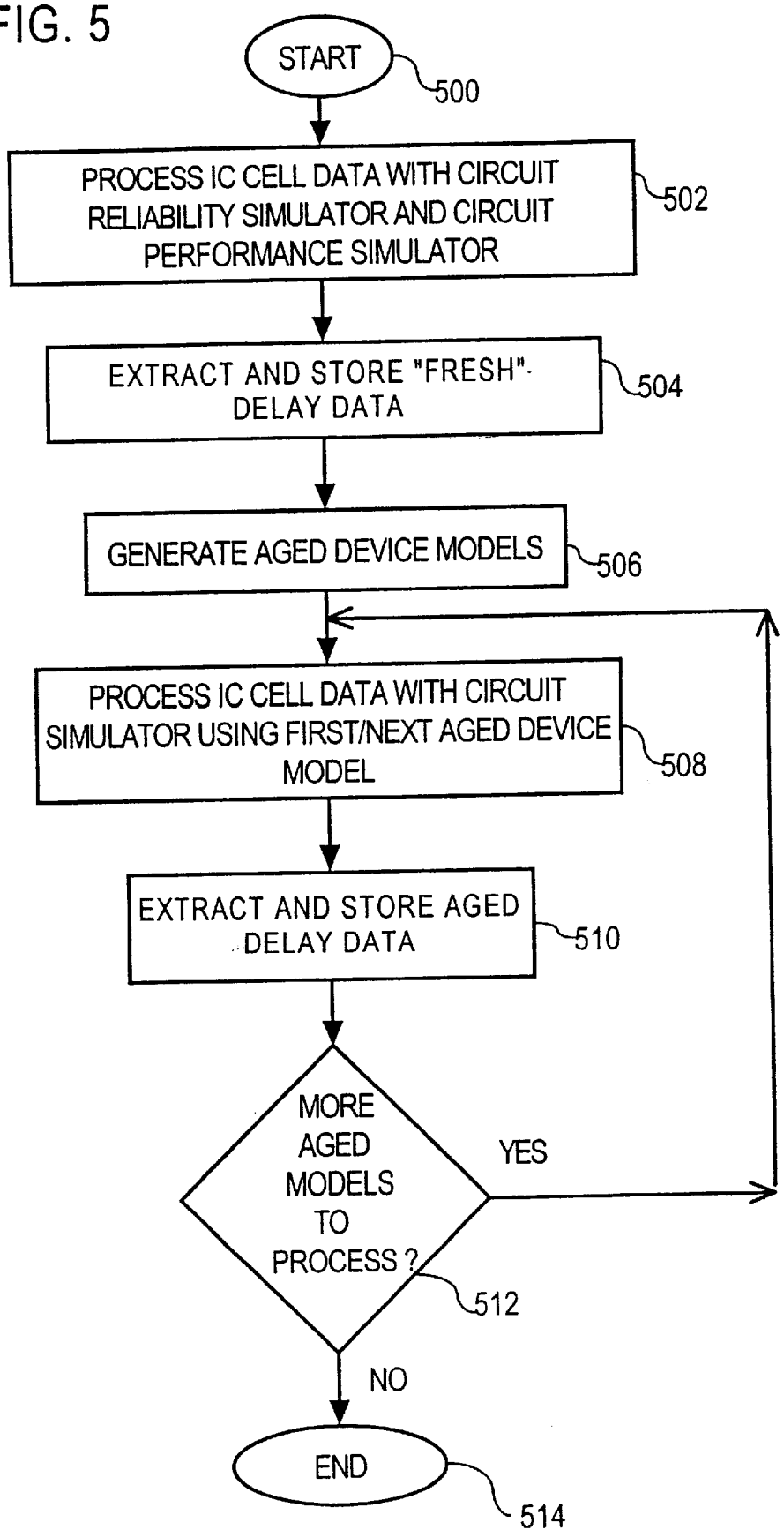

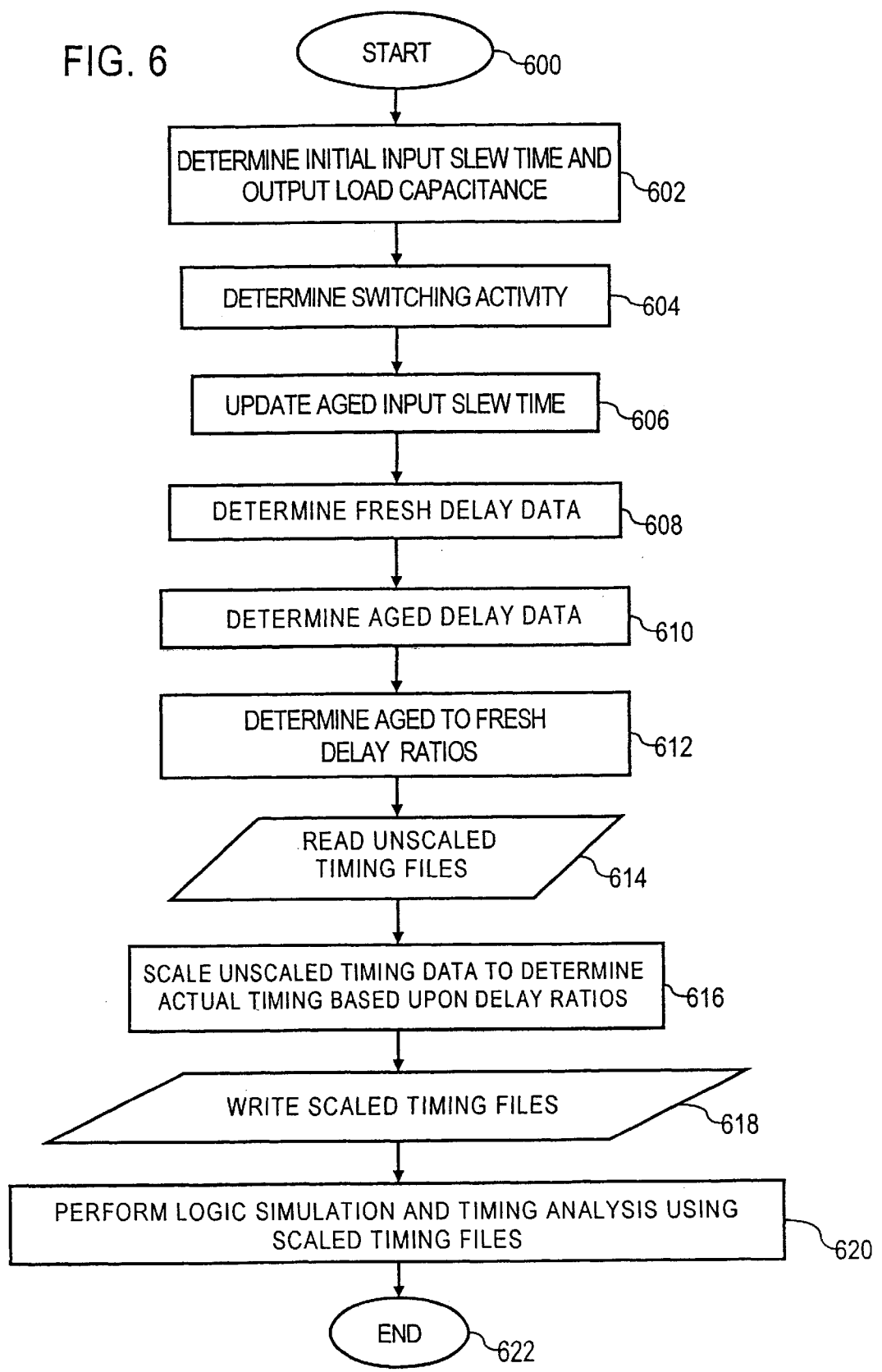

HOT CARRIER EFFECT SIMULATION FOR INTEGRATED CIRCUITS

FIELD OF THE INVENTION

The present invention relates to integrated circuit simulation, and more specifically, to simulating hot carrier effects for integrated circuits.

BACKGROUND OF THE INVENTION

Designing integrated circuits (ICs) has become more complex and time consuming as improvements in semiconductor fabrication technology allow millions of transistors to be formed on a single substrate. Given the extraordinary increase in the complexity of contemporary ICs and the pressure to quickly develop improved designs, designers increasingly rely upon various computer-aided design (CAD) tools to design ICs. Design improvements are often achieved by conducting trial and error testing of many possible design solutions and selecting the "best" design solution. Thus, IC CAD tools allow a designer to more quickly determine a "best" design foranIC.

Most IC CAD tools can be generally categorized as either layout tools or design tools. Layout tools help a designer to create an IC layout. In the context of IC design, an IC "layout" is a set of geometric patterns, typically in the form of polygons, which specify the size and location of different types of material used to create semiconductor devices, and electrical connections to be formed between the devices during the fabrication of an IC. For example, a diffusion window on an IC may be represented in a layout by one or more polygons which are interpreted by a fabrication facility to mean "diffusion layer geometry." Other layers of material and features, such as contacts and vias, may also be similarly represented in an IC layout.

The polygons in an IC layout must conform to a set of design rules which define minimum sizes for certain types of material as well as minimum spacing requirements between different types of material. The design rules also specify size and spacing requirements for other layout features such as contacts. IC layout tools can automatically identify design rule violations as the layout is generated, allowing them to be corrected before the layout is completed. Once an IC layout has been created, IC design tools can be used to test the IC layout by simulating the performance of the IC layout. Although there are many different types of IC design tools, two important types of IC design tools are IC simulation tools and IC reliability tools.

Conventional IC simulation tools combine functional device connections with physical models and parameters, such as device dimensions and junction areas, to produce simulated waveforms of current/voltage versus time, as well as frequency response, for ICs under development. IC simulation tools provide a preview of IC performance and can help identify logic and timing errors in an IC design. An example of a well known transistor level IC simulation tool is SPICE (Simulation Program for Integrated Circuit Emphasis), developed at the University of California at Berkeley.

One of the limitations of IC simulation tools is that they do not account for IC performance degradation attributable to hot carrier effects. Hot carrier effects are a well known physical phenomenon that can degrade the performance of an IC over time. Consequences of long term hot carrier effects include an increased threshold voltage, reduced transconductance and a reduction in device switching speed which can change the response of an IC and in extreme cases, cause IC failure. As device dimensions in contemporary ICs are reduced and supply voltages are less scaled hot carrier effects become more acute and can significantly decrease the lifetime of an IC.

Numerous techniques are known for reducing IC degradation attributable to hot carrier effects. For example, supply voltages can be decreased, the operation frequency of ICs can be reduced or special drain structures such as lightly-doped drain structures can be introduced. Each of these approaches is a design trade-off that can adversely affect IC performance, increase the size of the IC or add complexity to a fabrication process. To select the best approach for addressing hot carrier effects in an IC while optimizing IC performance, designers must be able to characterize and simulate hot carrier effects on ICs. In response to the need for evaluating long term hot carrier effects on semiconductor device performance, various IC reliability tools have been developed.

A few IC reliability tools have been developed to model hot carrier effects on semiconductor device performance. These tools are particularly helpful for determining hot carrier effects on semiconductor devices because determining hot carrier effects requires solving several complex equations. Specifically, calculation of the maximum electric field near the drain of a transistor is a complex procedure that requires a computer-aided solution of a two-dimensional Poisson equation.

Although IC reliability tools can provide a relatively accurate model of hot carrier effects on a single semiconductor device, they have not been successfully employed to model hot carrier effects on an entire IC because of the overwhelmingly large amount of computing resources required to model hot carrier effects for thousands or tens of thousands of devices. An example of a commercially available IC reliability simulator is BTABERT by BTA Technology, Inc., of Santa Clara, Calif. BTABERT is an IC reliability simulator that can characterize device degradation due to hot carrier effects under certain operating conditions. Once the device degradation due to hot carrier effects is characterized, aged SPICE models and aged waveforms can be generated. This approach is accurate but slow. It also has the limitation of not being able to simulate large ICs that may have millions of devices.

One approach for modeling hot carrier effects of an entire IC involves characterizing the hot carrier effects for certain "standard" devices separately and then using those standard characterizations to estimate the hot carrier effects on an entire IC. This approach requires significantly fewer computational resources than an approach that characterizes every device in an IC separately, since it assumes that all devices of a particular type are equally affected by hot carrier effects. This approach has several disadvantages. First, many ICs use multiple variations of "standard" devices to accommodate different layout topologies. These variant devices often have different hot carrier characteristics. Furthermore, even identical copies of a "standard" device may have different hot carrier characteristics because the hot carrier characteristics of a particular device depend upon the proximity of the particular device to other devices in the IC and the switching frequency of the particular devices. Consequently, the approach of approximating the hot carrier effects on an entire IC using the above approach does not provide an accurate characterization of the hot carrier effects on an entire IC.

Based on the need to simulate the hot carrier effects on an entire IC and the limitations in the prior approaches, an approach for simulating hot carrier effects on an entire IC that provides a relatively accurate characterization, while requiring relatively fewer computational resources than prior approaches, is highly desirable.

SUMMARY OF THE INVENTION

One aspect of the invention is a method for simulating hot carrier effects in an integrated circuit (IC) that contains a plurality of semiconductor devices, the method comprising the steps of: receiving IC cell data that specifies a set of one or more cells in the IC, each cell containing one or more of the plurality of semiconductor devices; generating delay data and unscaled timing data of the set of one or more cells; generating, based upon the delay data and switching activity of each cell, aged delay data that reflects time-based performance degradation of time delays for the set of one or more cells; and generating, based upon unscaled timing data that specifies timing delays associated with the set of one or more cells, scaled timing data by scaling the unscaled timing data with a delay ratio, wherein the delay data and the aged delay data are used to determine the delay ratio.

Another aspect of the invention involves a computer system for simulating hot carrier effects in an integrated circuit (IC) that contains a plurality of semiconductor devices, the computer system comprising: one or more processors; and a memory communicatively coupled to the one or more processors and containing instructions which, when executed by the one or more processors, cause the one or more processors to perform the steps of: receiving IC cell data that specifies a set of one or more cells in the IC, each cell containing one or more of the plurality of semiconductor devices; generating delay data and unscaled timing data of the set of one or more cells; generating, based upon the delay data and switching activity of each cell, aged delay data that reflects time-based performance degradation of time delays for the set of one or more cells; and generating, based upon unscaled timing data that specifies timing delays associated with the set of one or more cells, scaled timing data by scaling the unscaled timing data with a delay ratio, wherein the delay data and the aged delay data are used to determine the delay ratio.

One aspect of the invention is a method for simulating hot carrier effects in an integrated circuit (IC) that contains a plurality of semiconductor devices, the method comprising the step of: receiving IC cell data that specifies a set of one or more cells in the IC, each cell containing one or more of the plurality of semiconductor devices; generating unscaled timing data for the set of one or more cells in the IC and fresh delay data, the fresh delay data being a delay time for primitive cells which define a particular cell of the one or more cells; generating, based upon the fresh delay data and switching activity of each cell, aged delay data, the aged delay data reflecting time based performance degradation of the primitive cells; generating delay ratios based upon the fresh delay data and the aged delay data of each primitive cell, and generating scaled timing data based upon both the delay ratio and the unscaled timing data.

Other aspects and features of the invention will become apparent from the following description and claims:

BRIEF DESCRIPTION OF THE DRAWINGS

Embodiments of the invention are illustrated by way of example, and not by way of limitation, in the figures of the accompanying drawings and in which like reference numerals refer to similar elements and in which:

FIG. 3A is a chart illustrating performance degradation of a cell due to hot carrier effects;

FIG. 4C illustrates the contents of a hot carrier library generated in accordance with an embodiment;

FIG. 5 is a flow chart illustrating a method for generating hot carrier library data for a cell according to an embodiment;

FIG. 6 is a flow chart illustrating a method for simulating hot carrier effects of an integrated circuit using data contained in a hot carrier library generated according to the method of FIG. 5;

DETAILED DESCRIPTION OF THE PREFERRED EMBODIMENT

In the following description, for the purposes of explanation, specific details are set forth in order to provide a thorough understanding of the invention. However, it will be apparent that the invention may be practiced without these specific details. In other instances, well-known structures and devices are depicted in block diagram form in order to avoid unnecessarily obscuring the invention.

Functional Overview

A hot carrier simulation tool that simulates hot carrier effects of an IC at the circuit level is provided. The hot carrier simulation tool includes a hot carrier library generator and a hot carrier simulator that are used during two phases of simulation. During the first phase, the hot carrier library generator generates hot carrier library data that includes hot carrier delay data for each cell in an IC design.

During the second phase, the hot carrier simulator uses the hot carrier delay data to determine scaling-based aged timing data for each cell instance that is used to scale cell instance delay data and generate scaled delay data. The scaled delay data is used with a generic IC simulation program to provide a hot carrier simulation at the IC level. The hot carrier simulation tool described herein may be used with an entire IC or with portions thereof, depending upon the particular simulation desired. For example, in some situations a simulation of an entire IC is desirable so that the hot carrier effects on the entire IC can be determined. In other situations, it may be desirable to simulate a portion of an IC in which hot carrier effects are a particular concern, so that a layout or fabrication process can be fine tuned. For example, an IC may have a portion containing relatively small and tightly packed devices where the hot carrier effects are of particular concern. Using the hot carrier simulation tool described herein, hot carrier effects on the particular portion of the IC may be simulated separately, or with the entire IC.

Detailed Description

Figure 1:
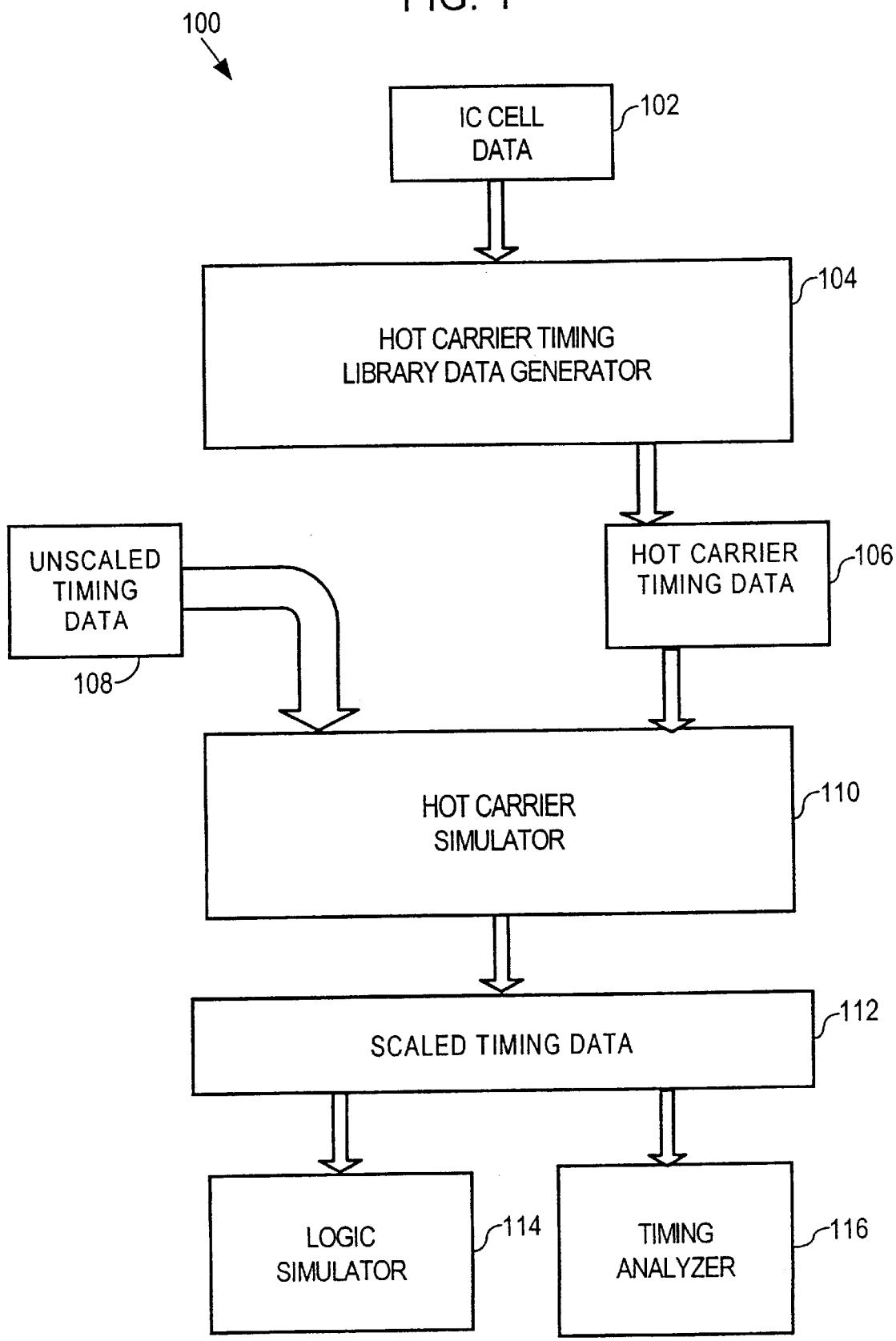
FIG. 1 is a block diagram of an approach for simulating hot carrier effects in an integrated circuit according to an embodiment.

FIG. 1 is a top level block diagram illustrating an approach and arrangement 100 for simulating hot carrier effects on an IC according to an embodiment. IC cell data 102 is provided to a hot carrier timing library data generator 104. In general, IC cell data 102 specifies characteristics and properties of the cells in the IC that are to be included in the simulation. The specific contents of IC cell data 102 are described in more detail hereinafter.

During the first phase, hot carrier timing library data generator 104 operates on IC cell data 102 and provides hot carrier timing library data 106 that includes hot carrier data for each cell in the IC to be included in the simulation. During the second phase, hot carrier timing library data 106 and input timing data 108 are provided to and processed by a hot carrier simulator 110 that provides scaled timing data 112. Scaled timing data 112 is provided to a logic simulator 114 which simulates hot carrier effects on the cells comprising an IC at the gate level. Scaled timing data 112 is also provided to a timing analyzer 116 to provide a timing analysis. The first (hot carrier Library Generation) and second (hot carrier Simulation) phases are now described in more detail.

I. Hot Carrier Timing Library Data Generation

In general, during the first phase, hot carrier timing library data is generated by hot carrier timing library data generator 104 for each cell in an IC to be simulated. To accomplish this, an IC is divided into a set of cells, for which hot carrier library data is separately determined. Examples of IC cells include medium scale integration (MSI) devices such as adders and shift registers. Another example of an IC cell is logic gates such as AND, NOR or XOR gates. The set of cells included in a particular IC simulation varies from simulation to simulation. For multiple stage cells, the delay from an input to an output is divided into two or more paths, each having different hot carrier degradation. Hot carrier primitives are used to provide a more accurate characterization of hot carrier degradation as described in more detail hereinafter. Hot carrier timing library data is generated for all hot carrier primitives during hot carrier timing library data generation.

A. Input Data

Figure 2A:
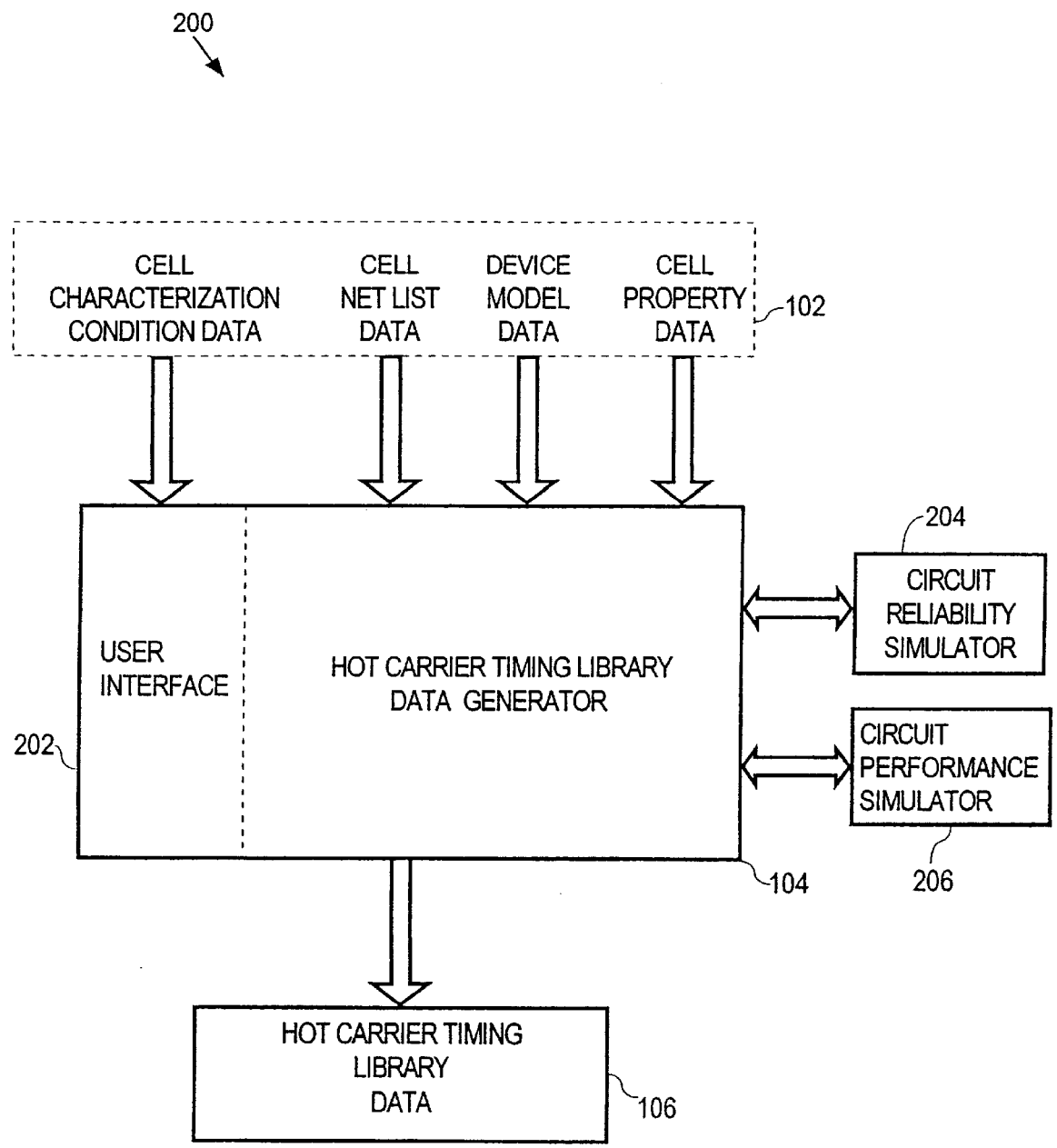
FIG. 2A is a detailed block diagram illustrating a portion of the approach of FIG. 1 according to an embodiment.

FIG. 2A is a block diagram, generally referred to by the reference numeral 200, illustrating the generation of hot carrier timing library data 106 in more detail. As previously described, IC cell data 102 is provided to hot carrier timing library data generator 104 which processes IC cell data 102 and provides hot carrier timing library data 106. According to one embodiment, IC cell data 102 includes four types of data: (1) cell characterization and condition data; (2) cell netlist data; (3) device model data; and (4) cell property data. According to one embodiment, the cell characterization and condition data is provided to hot carrier timing library data generator 104 via a user interface 202. User interface 202 may be a graphical user interface (GUI) allowing a user to specify the cell characterization and condition data by selecting pull-down menus and populating input fields. Each of the four types of IC cell data 102 are described hereinafter.

1. Cell Characterization Condition Data

The cell characterization condition data represents cell operation conditions, such as the power supply voltage, operating temperature, the input slew (rise/fall) time range, the output load capacitance range and an operating lifetime range. For each range multiple values which represent characterization points are provided. Other parameters such as delay measurements, threshold voltage ($V_{th}$) and output slew high voltage ($V_{SH}$) and output slew low voltage ($V_{SL}$) are also included in the condition data. $V_{SH}$ and $V_{SL}$ are used to determine slew rise and fall times.

Figure 2B:
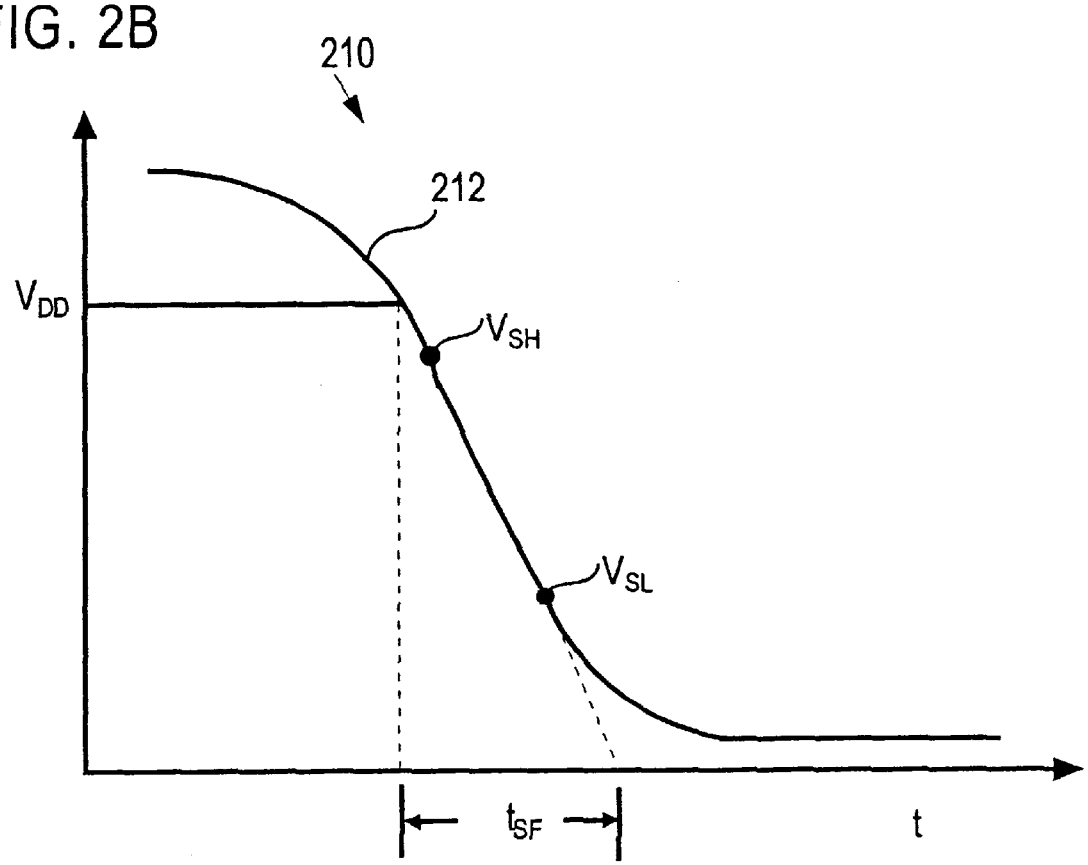
FIG. 2B is a chart illustrating the determination of a slew fall time based on the extrapolated time required for an output voltage to reach a slew low voltage level according to an embodiment.
Figure 2C:
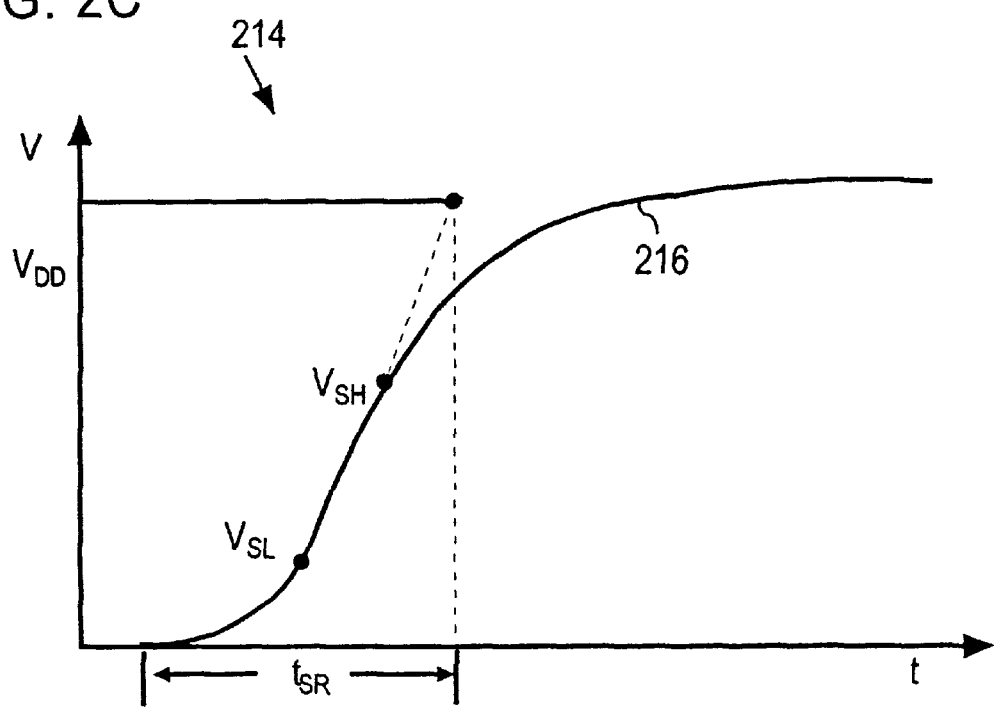
FIG. 2C is a chart illustrating the determination of a slew rise time based on the extrapolated time required for an output voltage to reach a slew high voltage level according to an embodiment.

FIG. 2B is a chart 210 illustrating the determination of a slew fall time ($t_{SF}$) based on the extrapolated time required for an output voltage, represented by curve 212, to reach the $V_{SL}$ voltage level, which typically represents about 20% of VDD. FIG. 2C is a chart 214 illustrating the determination of a slew rise time ($t_{SR}$) based on the extrapolated time required for an output voltage, represented by curve 216, to reach the VSH voltage level, which typically represents about 80% of $V_{DD}$.

2. Cell Netlist Data

The cell netlist data specifies the devices and parasitics in each cell and for each device, specifies a characteristic and electrical connection. The characteristic depends upon the particular device type. For example, for a resistor the characteristic specifies a resistance, for a capacitor a capacitance and for a transistor the dimensions, such as gate length. The electrical connection specifies locations in the IC to which each terminal is connected, typically in terms of IC nodes. For example, a resistor identified as "R1" bas a resistance of "OK" and the first and second terminals of R1 are connected to nodes "N1" and "N2" respectively.

3. Device Model Data

The device model data includes time-based mathematical models used during circuit simulation to determine voltages and currents at each node within the cells. IC device mathematical models typically include a set of device parameters and a set of complex equations which must be solved to simulate device performance. Most commercially available circuit simulation packages provide default device parameters and models which can be modified to suit a particular fabrication process or application. Examples of such a simulation package are Star-Hspice by Avant! Corporation of Fremont, Calif., SPECTRE by Cadence Design Systems of San Jose, Calif. and SPICE. The device model data includes "aged" device models that model device performance at different device ages.

4. Cell Property Data

The cell property data specifies properties for each cell including a cell name, cell input and output pin identifiers, e.g. "INPUT1", "INPUT2", "OUTPUT1", etc. The cell property data also defines particular cell function input stimulus and the expected cell response to the particular input stimulus. Specifically, the cell response to particular input stimulus specifies the outputs based upon all input combinations. For example, for a cell having two inputs (A, B) and one output (Y), the following cell response is provided:

| A | B | Y |
|---|---|---|
| 0 | R | LOW |
| R | 0 | LOW |
| 1 | R | LOW to HIGH |
| 1 | F | HIGH to LOW | where "0" and LOW are logical LOWs, "1" and HIGH are logical HIGHs, "R" ("rise") means an input is changing from a logical LOW to a logical HIGH and "F" ("fall") means an input is changing from a logical HIGH to a logical LOW.

B. Input Data Processing

Hot carrier timing library data generator 104 processes IC cell data 102 using a circuit reliability simulator 204 to determine the reliability of each IC cell based upon performance degradation of each cell attributable to hot carrier effects. Hot carrier timing library data generator 104 also processes IC cell data 102 using a circuit performance simulator 206 to simulate the performance of the cells at different cell ages, accounting for circuit performance degradation attributable to hot carrier effects. Hot carrier timing library data generator 104 measures the performance of the cells and specifically measures the delay of the cells when the cell degradation due to hot carrier effects is considered.

FIG. 3A is a chart 300 illustrating performance degradation of an example cell (not illustrated) due to hot carrier effects. Chart 300 includes an input curve 302 that illustrates a rising voltage level (V) applied to an input of the example cell over times (t). Chart 300 also includes three output curves 304, 306 and 308, representing the response of the cell at an age of zero years, one year and two years, respectively. The cell requires more time for the output level ($V_{out}$) to fall from voltage ($V_{DD}$) to an arbitrary voltage level ($V_1$) as the cell ages. Specifically, as illustrated by curve 304, with no aging and therefore no performance degradation due to hot carrier effects, the cell requires $t_1$ time for the output to reach the $V_1$ level. As illustrated by curve 306, after 1 year the cell requires time $t_2$ for the output to reach the $V_1$ level. As illustrated by curve 308, after 2 years the cell requires time $t_3$ for the output to reach the VI level. Thus, the response time of the cell degrades over time due to hot carrier effects.

C. Source Table Delay Model

According to one embodiment, a source table delay model is used to characterize the driving strength of a cell based upon different input slew times (ts) and output load capacitances (cl) and to accurately determine interconnect delays and output slew times. A driving source table is built for each cell based upon the model. The values contained in the driving source table are used to determine fresh time delays and aged time delays as illustrated in FIG. 3A.

Figure 3B:
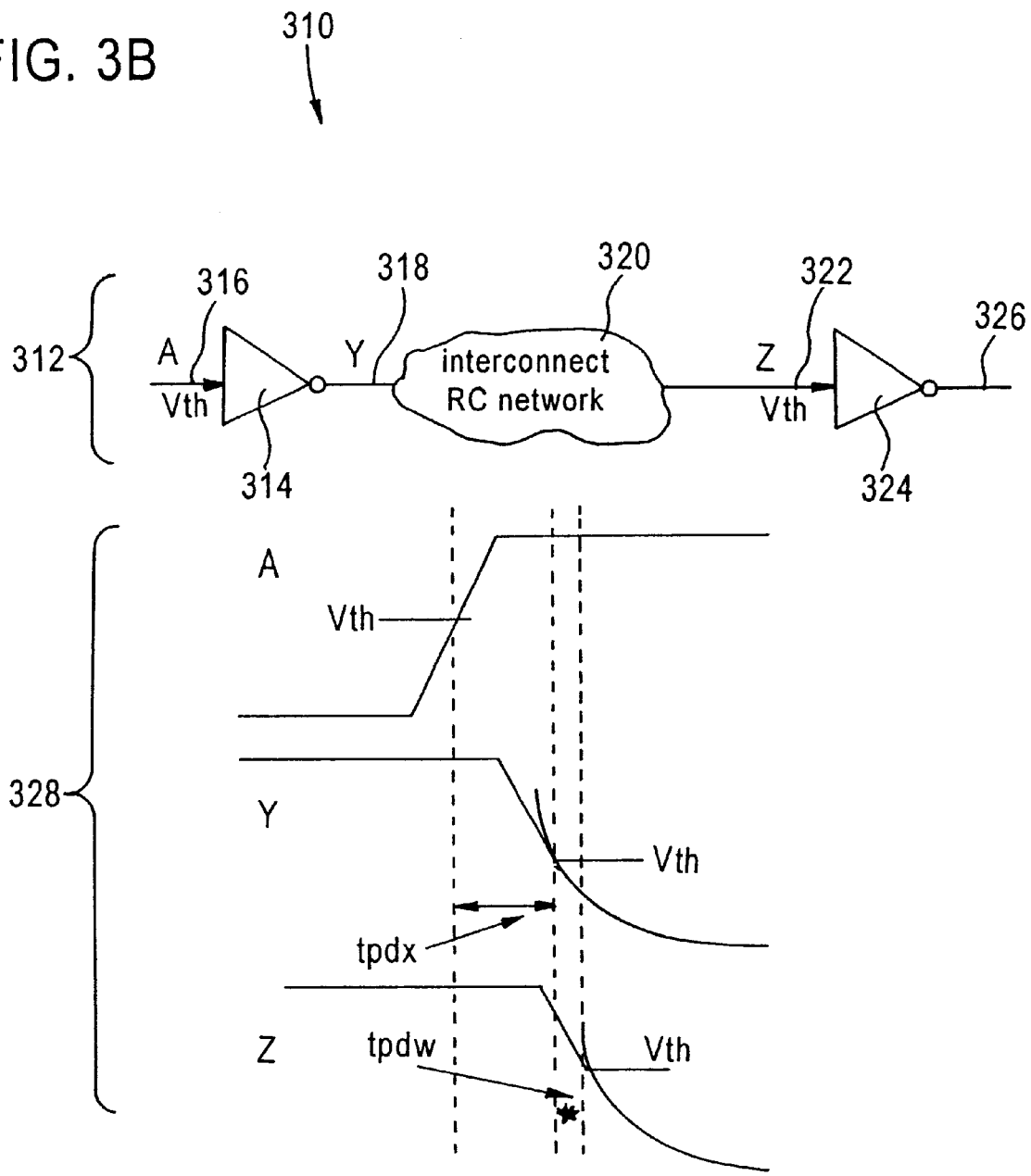
FIG. 3B illustrates a source table delay model according to an embodiment.

FIG. 3B illustrates a source table delay model 310 used to determine values for a driving source table according to an embodiment. Source table delay model 310 includes an IC cell instance 312 and a chart 328. IC cell instance 312 comprises a gate 314 having an input 316 ("A") and an output 318 ("Y"). Output 318 ("Y") is coupled through an interconnect 320, such as an RC network, to an input 322 ("Z") of a second gate 324. Gate 324 provides a signal on an output 326.

Chart 328 illustrates propagation delays associated with the operation of IC cell instance 312. The gate threshold voltage, used as a delay measurement reference point, is denoted by "$V_{th}$". An I/O path delay, denoted by "tpdx", represents the propagation delay from input 316 ("A") to output 318 ("Y"). "Tpdx" is the time that output 318 ("Y") requires to "fall" after input 316 ("A") has crossed the threshold voltage ($V_{th}$). I/O path delay "tpdx" is represented as a two-dimensional table of input slew times (ts) and output load capacitance (cl), such as table 350 of FIG. 3C.

An interconnect delay, denoted by "tpdw", represents the propagation delay from output 318 ("Y") to input 322 ("Z"). Because of delays associated with interconnect RC network 320, there is a delay between the time when output 318 ("Y") "falls" and when input 322 ("Z") "falls".

A driving source delay for gate 314 is represented by the propagation delay from input 316 ("A") to input 324 ("Z"). The driving source delay is also represented herein as a two-dimensional table of input slew times (ts) and output load capacitance (cl), such as table 350 of FIG. 3C. Values in driving source table 350 are used to calculate the interconnect delay denoted as "tpdw".

Figure 3C:
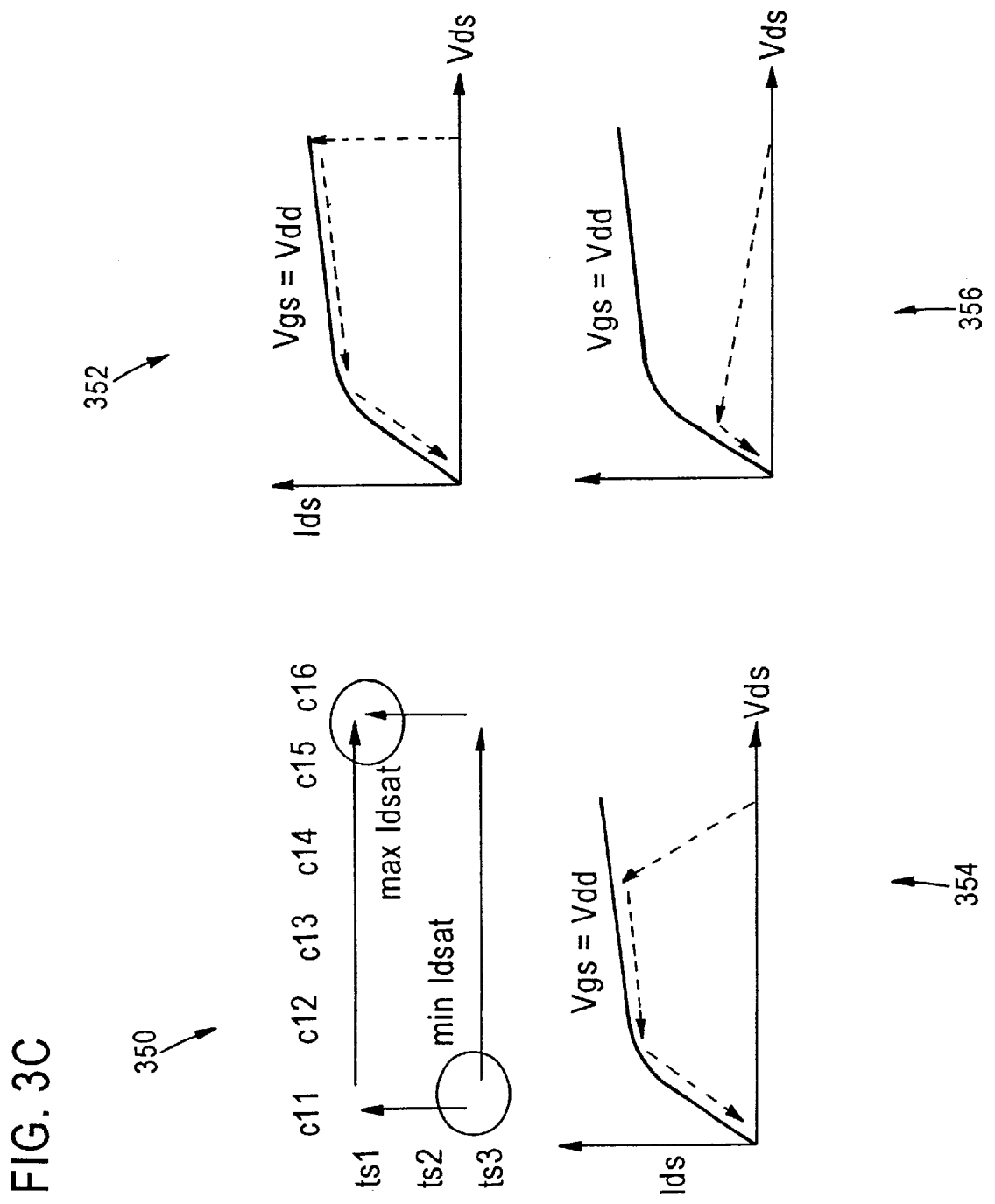
FIG. 3C comprises four (4) graphs illustrating the characteristics of a driving transistor according to an embodiment.

FIG. 3C also includes graphs 352, 354 and 356 that illustrate the characteristics of a driving transistor according to an embodiment. The driving transistor's output characteristics are characterized over a saturation region and a linear region where the driving transistor is operating in saturation and linearly, respectively. In the saturation region, a constant current source, Idsat, and a linear resistor, where R=Vdsat/Idsat, are used. The transistor's output characteristics depend upon the change in gate voltage (Vgs) and the change in drain voltage (Vds). Specifically, graph 352 illustrates the transistor output characteristics for a small ts and a large cl. Graph 354 illustrates the transistor output characteristics for a medium ts and a medium cl. Graph 356 illustrates the transistor output characteristics for a large ts and a small cl.

Figure 3D:
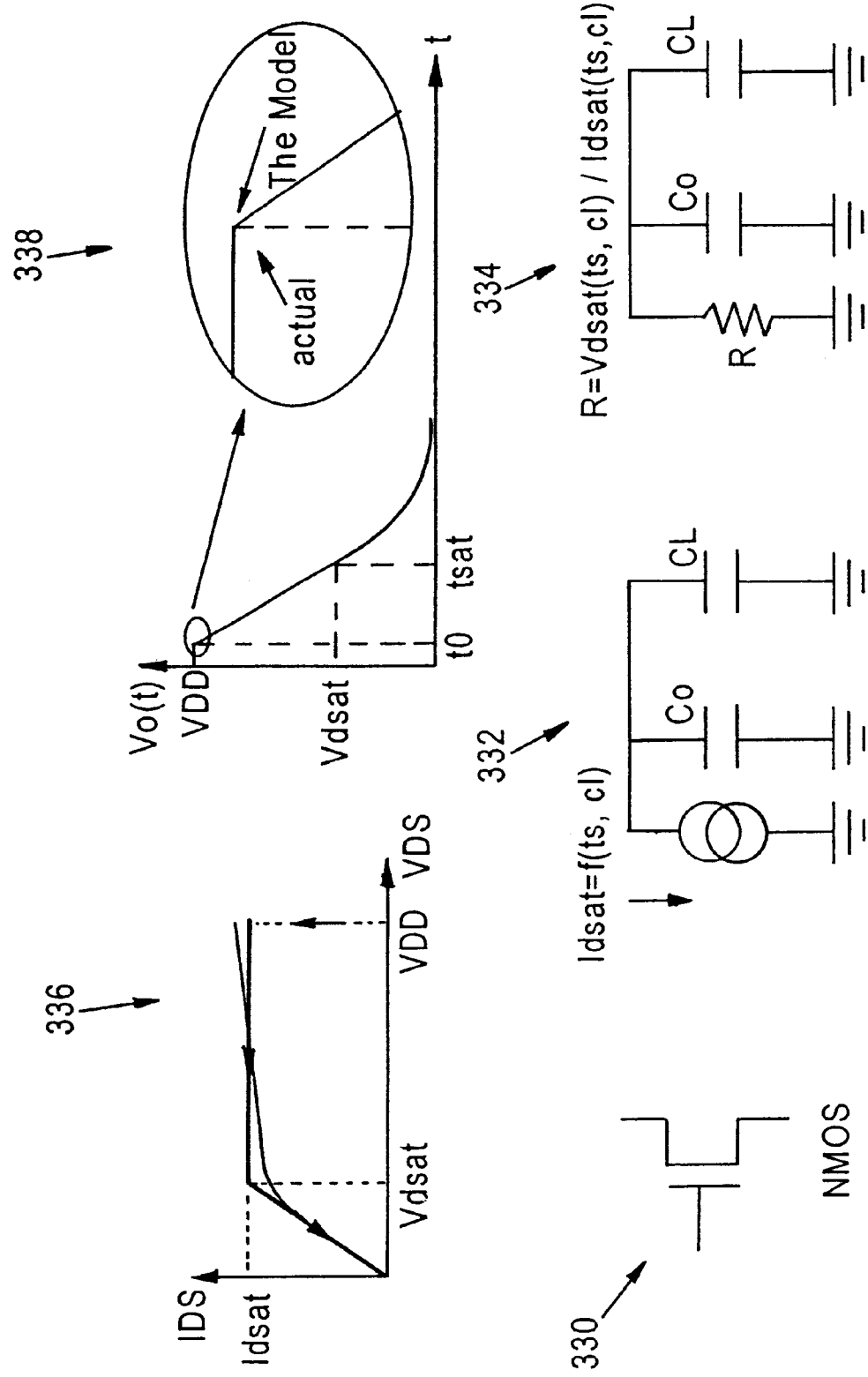
FIG. 3D illustrates models used to characterize the operation of an NMOS transistor when operating in its saturation region and in its linear region according to an embodiment.

FIG. 3D illustrates models used to characterize the operation of an NMOS transistor 330 when operating in its saturation region and in its linear region according to an embodiment. Model 332 is used to characterize the operation of NMOS transistor 330 when operating in the saturation region. The drain saturation current (Idsat) is a function of ts and c1. The following equation is used to characterize the operation of NMOS transistor 330 when operating in the saturation region:

$$For VDD > Vo(t) > Vdsat: \quad (1)$$
$$Vo(t) = VDD - \frac{Idsat}{Co + CL}(t - t0)$$

Model 334 is used to characterize the operation of NMOS transistor 330 when operating in the linear region. The value of resistor "R" is a ratio of the saturation voltage as a function of ts and c1 (Vdsat(ts, c1)) to the saturation current as a function of ts and c1 (Idsat (ts,c1)).

The following equation is used to characterize the operation of NMOS transistor 330 when operating in the linear region:

$$For Vo(t) < Vdsat: \quad (2)$$
$$Vo(t) = Vdsat e^{-\frac{Idsat(t-tsat)}{(Co+CL)Vdsat}}$$

Graph 336 illustrates the relationship between the drain saturation current (Idsat) and the drain saturation voltage (Vdsat). Graph 338 illustrates the output voltage (Vo) as a function of time (Vo(t)).

Figure 3E:
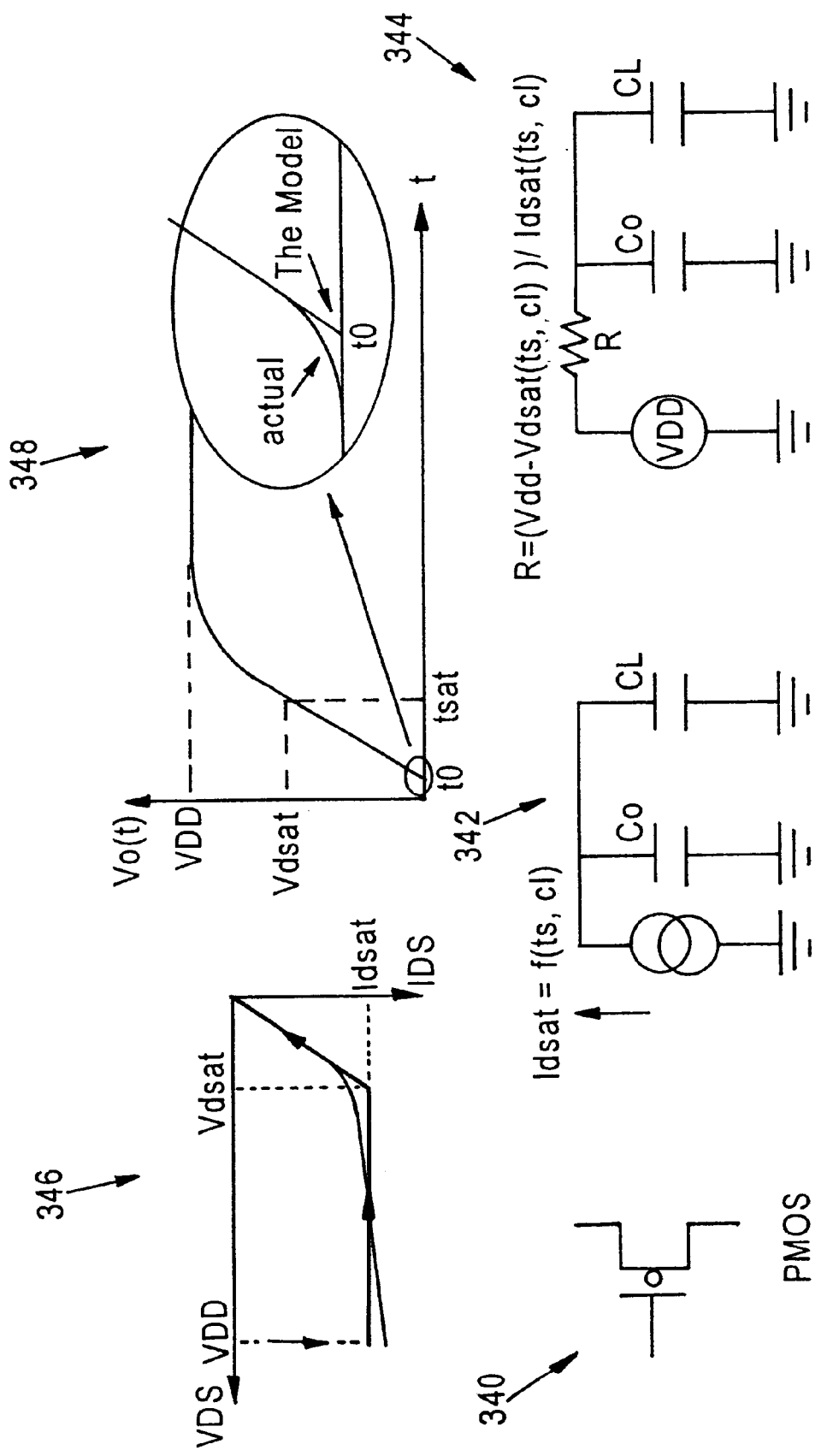
FIG. 3E illustrates models used to characterize the operation of an PMOS transistor when operating in its saturation region and in its linear region according to an embodiment.

FIG. 3E illustrates models used to characterize the operation of an PMOS transistor 340 when operating in its saturation region and in its linear region according to an embodiment. Model 342 is used to characterize the operation of PMOS transistor 340 when operating in the saturation region. The drain saturation current (Idsat) is a function of ts and c1. The following equation is used to characterize the operation of PMOS transistor 340 when operating in the saturation region:

$$For 0 > Vo(t) > Vdsat: \quad (3)$$
$$Vo(t) = \frac{Idsat}{Co + CL}(t - t0)$$

Model 344 is used to characterize the operation of PMOS transistor 340 when operating in the linear region. The value of resistor "R" is a ratio of the difference between VDD and the saturation voltage as a function of ts and c1 (Vdsat(ts, c1)) to the saturation current as a function of ts and c1 (Idsat (ts,c1)).

The following equation is used to characterize the operation of PMOS transistor 340 when operating in the linear region:

$$For Vo(t) > Vdsat: \quad (4)$$
$$Vo(t) = Vdsat + (VDD - Vdsat)\left(1 - e^{-\frac{Idsat(t-tsat)}{(Co+CL)Vdsat}}\right)$$

Graph 346 illustrates the relationship between the drain saturation current (Idsat) and the drain saturation voltage (Vdsat). Graph 348 illustrates the output voltage (Vo) as a function of time (Vo(t)).

D. Stimulus Patterns

Hot carrier timing library data 106 includes delay data for each cell that is to be included in the hot carrier circuit simulation. The delay data for each cell includes a set of delay data for each stimulus pattern of the cell. As used herein, the term "stimulus pattern" means a particular set of output values based upon a particular set of input values. The number of stimulus patterns for a cell depends upon the number of cell inputs and outputs and the functionality of the cell. Separate delay data are required for each stimulus pattern because the performance degradation of a cell attributable to hot carrier effects can vary for different stimulus patterns.

Figure 4A:
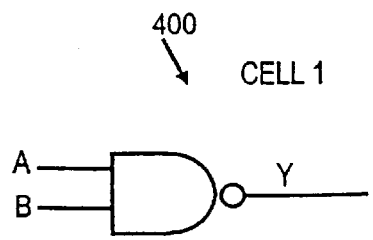
FIG. 4A illustrates a two input logical NAND gate.
Figure 4B:
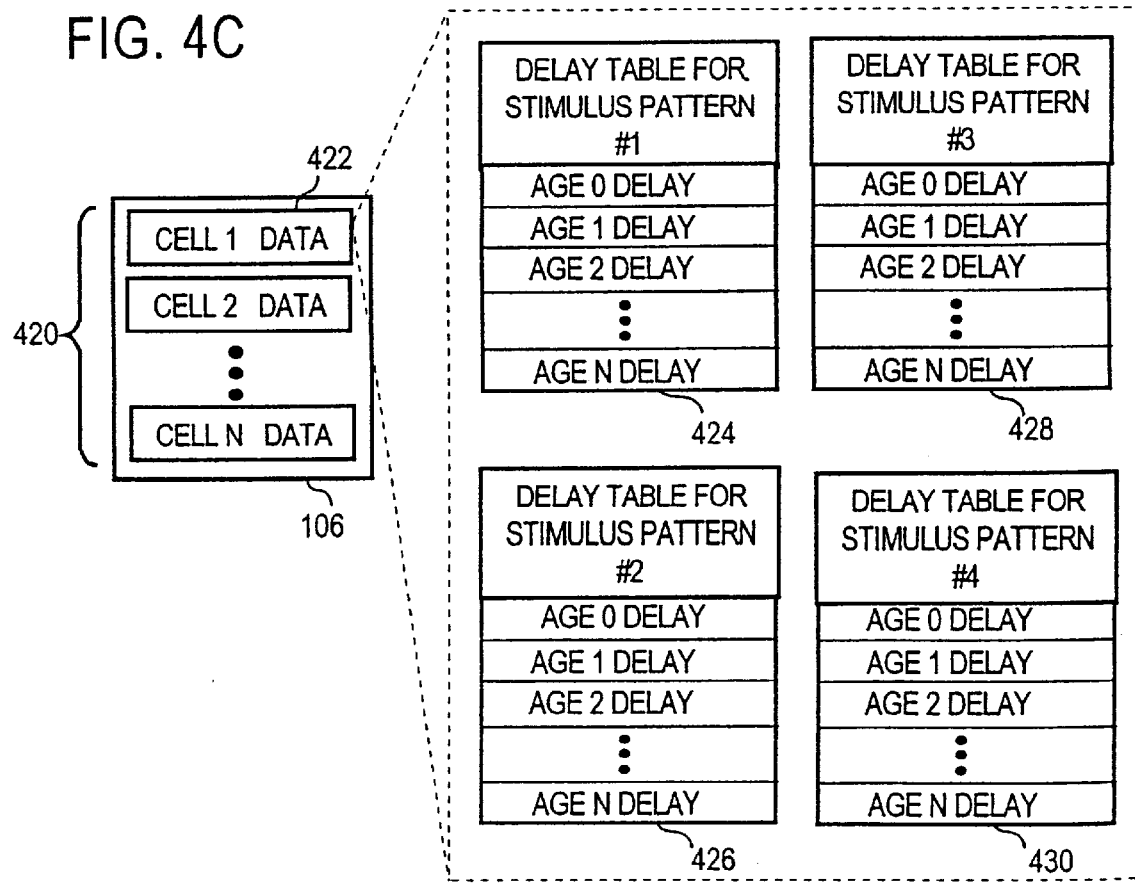
FIG. 4B illustrates a table of stimulus patterns associated with the logical NAND gate of FIG. 4A according to an embodiment.

FIG. 4A illustrates a cell 400, "CELL1", comprising a logical NAND gate with two inputs "A" and "B" and one output "Y". FIG. 4B is a table 402 illustrating the four stimulus patterns 404, 406, 408 and 410 for cell 400 of FIG. 4A. Stimulus patterns 404 and 406 correspond to the two situations when input A is held at a logical HIGH and input B is varied. Specifically, stimulus pattern 404 corresponds to the situation where input A is held at a logical HIGH and input B changes (rises) from a logical LOW to a logical HIGH. Stimulus pattern 406 corresponds to the situation where input A is held at a logical HIGH and input B changes (falls) from a logical HIGH to a logical LOW.

FIG. 4C illustrates the contents of hot carrier timing library data 106 according to an embodiment. Hot carrier timing library data 106 includes cell data 420 for each cell that is to be included in the IC hot carrier simulation. The cell data for each cell includes a set of age-based delay times for each stimulus pattern. The age-based delay times reflect the delay in cell response attributable to hot carrier effects. In the present example, CELL1 DATA 422 corresponds to cell 400 of FIG. 4A and contains the set of age-based delay times for each stimulus pattern. Since cell 400 (CELL1) has four stimulus patterns, CELL1 DATA 422 contains four delay tables 424, 426, 428 and 430 that correspond to stimulus patterns 404, 406, 408 and 410, respectively. Delay table 424 contains a set of age-based delay times for stimulus pattern #1 (404). The set of age-based delay times for stimulus pattern #1 (404) includes delay times for AGE0, which does not reflect any cell performance degradation attributable to hot carrier effects, as well as delay times for other ages.

The number and granularity of the aged delay times is based upon the age information received by hot carrier timing library data generator 104. For example, the age information contained in the cell characterization condition data may specify that the hot carrier simulation be performed for ten years on a yearly basis. Delay tables 424, 426, 428 and 430 would then each contain eleven entries, one entry for AGE0 and one entry for each of years one through ten. According to one embodiment, the delay data for a particular stimulus pattern is represented by a two-dimensional array of delay times based upon input slew times and output load capacitances. Establishing separate delay data for each stimulus pattern of each cell over time provides a more accurate hot carrier simulation.

FIG. 5 is a flow chart illustrating a method for generating hot carrier timing data 106 for a cell according to an embodiment. After starting in step 500, in step 502, IC cell data 102 is processed with circuit reliability simulator 204 and circuit performance simulator 206 to characterize performance degradation attributable to hot carrier effects for each device in the cell. Circuit reliability simulator 204 characterizes the performance degradation of the cell attributable to hot carrier effects. Circuit reliability simulator 204 is used in conjunction with circuit performance simulator 206 which provides the node voltages and currents required by circuit reliability simulator 204. An example of a suitable circuit reliability simulator is BTABERT by BTA Technology Inc., Santa Clara Calif. Examples of suitable circuit performance simulators include Star-Hspice and SPECTRE. Other circuit reliability and circuit simulation tools may be used.

In step 504, the "fresh" delay data for the cell is extracted from the results of processing the IC cell data 102 with circuit reliability simulator 204 and circuit performance simulator 206. The "fresh" delay data includes the cell delay without any performance degradation due to hot carrier effects. The "fresh" delay data is stored in the appropriate delay tables in hot carrier timing library data 106 as illustrated in FIG. 4C.

In step 506, a set of aged device models is generated for the cell using the results of the processing in step 502. The aged device models can be used by a circuit performance simulator to characterize the performance of the cell at a particular point in time, accounting for performance degradation of the cell attributable to hot carrier effects. For example, for the situation where the cell characterization condition data specified a simulation over a 10 year span at 1 year intervals, 10 aged models for years 1 through 10 would be generated. The 5 year model is a mathematical model that can be used to simulate the performance of the cell after 5 years, including any performance degradation attributable to hot carrier effects.

In step 508, IC cell data 102 is processed with circuit performance simulator 206 using the first aged device model generated in step 506 to simulate the cell's performance after the first time interval including any performance degradation attributable to hot carrier effects. In step 510, aged delay data is extracted from the results of processing IC data 102 and aged device model with circuit simulator 206. The aged delay data includes a delay data for each stimulus pattern of the cell after the first time interval. The delay data are stored in the appropriate delay tables in hot carrier timing library data 106 as illustrated in FIG. 4C.

In step 512 a determination is made whether any more aged models need to be processed. If so, then steps 508 and 510 are repeated until each of the aged models have been processed and all of the delay data stored in hot carrier timing library data 106. Once all of the aged models have been processed, the process is complete in step 514.

II. Hot Carrier Simulation

Figure 2D:
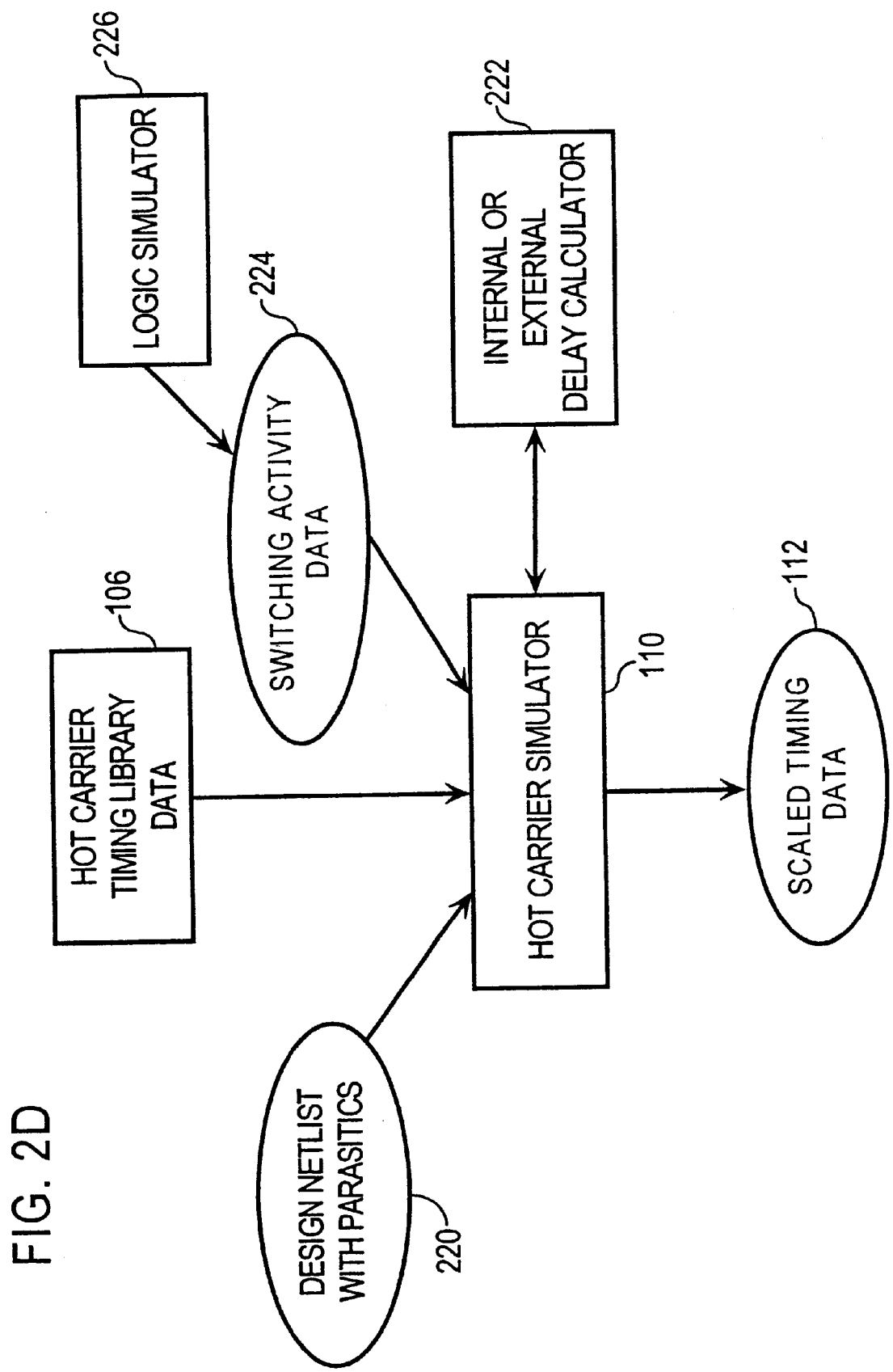
FIG. 2D is a detailed block diagram illustrating another portion of the approach of FIG. 1 according to an embodiment.

Referring again to FIG. 1, the hot carrier simulation phase involves hot carrier simulator 110 processing data contained in hot carrier timing library data 106 and user-supplied unscaled timing data 108 to provide scaled timing data 112. Scaled timing data 112 can then be used with a logic simulator 114 to provide hot carrier simulation of an IC at the gate level. Scaled timing data 112 may also be used with a timing analyzer 116 to provide a timing analysis. The specific steps in generating scaled timing data 112 based upon data contained in hot carrier timing library data 106 and user-supplied input timing data 108 is now described with reference to the block diagram of FIG. 2D and the flow chart of FIG. 6.

FIG. 6 is a flow chart illustrating a method for simulating hot carrier effects of an IC according to an embodiment. After starting in step 600, in step 602, the initial slew time and output load capacitance are determined for each instance. "Cell" represents both a circuit unit and a logic functionality of such circuit unit. "Instance", on the other hand, is a unique name to be put on each cell. The initial slew time and output load capacitance are extracted from a design netlist with parasitics 220 that is preferably a DSPF (Detailed Standard Parasitic Format) file using an internal or external delay calculator 222.

A. Switching Activity

In step 604 the switching activity for each instance is determined. For each cell instance, the number of times the cell outputs change state based upon a predetermined input stimulus during a specified simulation period is determined. Each instance output is evaluated against each instance input because different inputs may cause a different number of switches on a particular output, thereby contributing differently to performance degradation due to hot carrier effects. For example, referring again to cell 400 of FIG. 4A, input "A" may cause output "Y" to change state a certain number of times during a given simulation period. Input "B" may cause output "Y" to change state a different number of times during the same simulation period. The hot carrier effects on a device are related to the number of times that an instance output switches in response to which inputs change state. Therefore, the number of output state switches attributable to each input must be separately determined.

According to one embodiment, switching activity data 224 for an instance is determined by analyzing the response of an instance provided by a logic simulator 226. Accordingly, a logic simulator 226 is launched and the intermediate results evaluated to determine the switching activity for all instances in the IC. One logic simulator 226 found to be suitable for this purpose is Verilog-XL by Cadence Design Systems, Inc. of San Jose, Calif.

Figure 7:
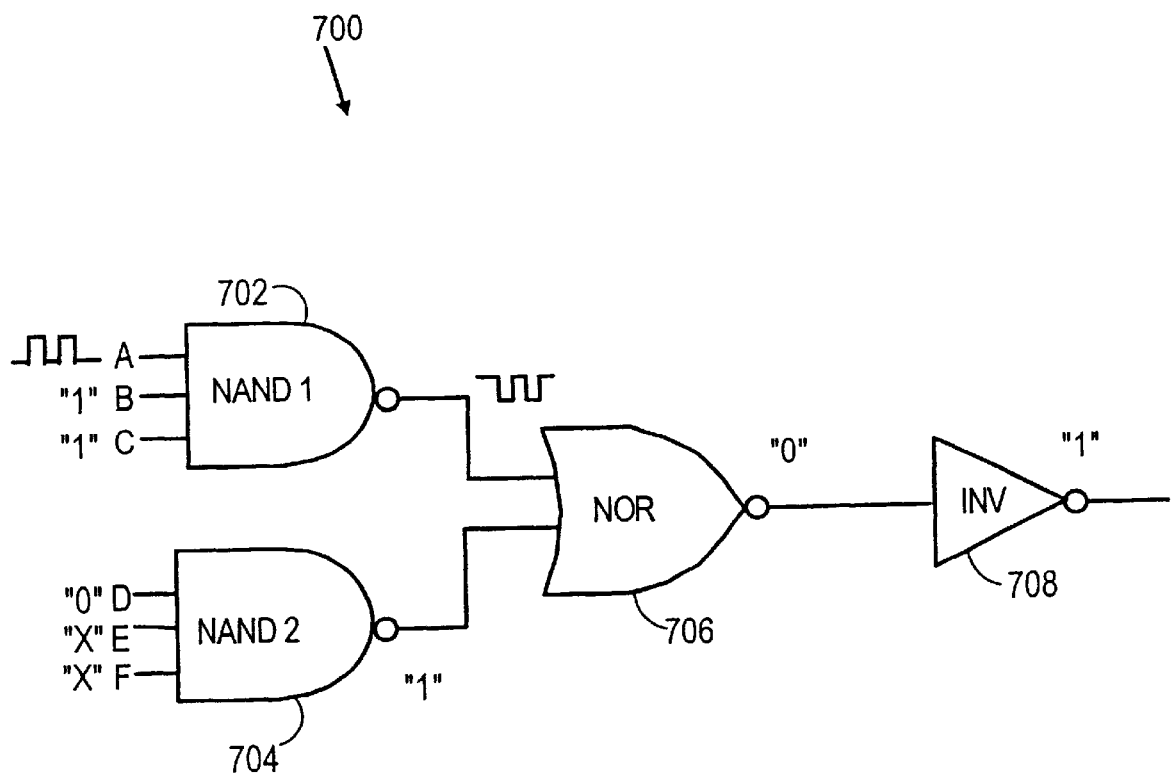
FIG. 7 illustrates a six input logical NAND cell.

In some situations the internal switching of a cell cannot be determined because of the combinational logic contained in the cell. In these situations, the cell is decomposed into its constituent parts and the switching activity for the constituent parts is separately determined. For example, consider the six input logical NAND cell 700 illustrated in FIG. 7. Cell 700 includes two three-input logical NAND gates identified as "NAND1" 702 and "NAND2" 704, coupled in parallel to a logical NOR gate, identified as "NOR" 706, coupled in series to an inverter, identified as "INV" 708. Since input D of NAND2 is a logical LOW ("0"), the output of NAND2 is a logical HIGH ("1"), regardless of the input values for inputs E and F. Since the output of NAND2 is a logical HIGH, the output of NOR is always a logical LOW. In addition, since the output of NOR is always a logical LOW, the output of inverter INV is always a logical HIGH. Consequently, although a square wave stimulus is applied to input A, the switching activity at the output of NAND1 cannot be detected from the switching activity of the output of inverter INV because the output of inverter INV is always a logical HIGH and does not change based upon the input stimulus on input A. In this situation, cell 700 is decomposed into constituent parts that can be separately evaluated. The switching activity of the constituent parts is used to determine the internal switching of cell 700. In this example, the switching activity of NAND1 and NAND2 is determined separately from the switching activity of NOR and inverter INV.

B. Hot Carrier Primitives

According to one embodiment, certain types of complex cells that would ordinarily be decomposed into constituent parts for purposes of determining switching activity, are instead analyzed according to a predetermined hot carrier primitive because the hot carrier effects for a hot carrier primitive can be accurately determined. For cells containing combinational logic, a hot carrier primitive is either a single stage CMOS circuit structure with one or more inputs and a single output or a multi-stage CMOS circuit structure that has a single input and a single output. An example of a multi-stage CMOS circuit structure having a single input and single output is a two stage buffer comprising two inverters. Hot carrier primitives are used so that the performance degradation attributable to hot carrier effects of a complex cell can be determined more accurately.

The switching activity of IC cells comprising flip-flops is determined based upon a hot carrier model for flip-flops because of the important role of sequential cells in timing analysis and the difficulty of decomposing these types of cells. A special delay model is used to determine input to output delays as described in more detail hereinafter.

Figure 8:
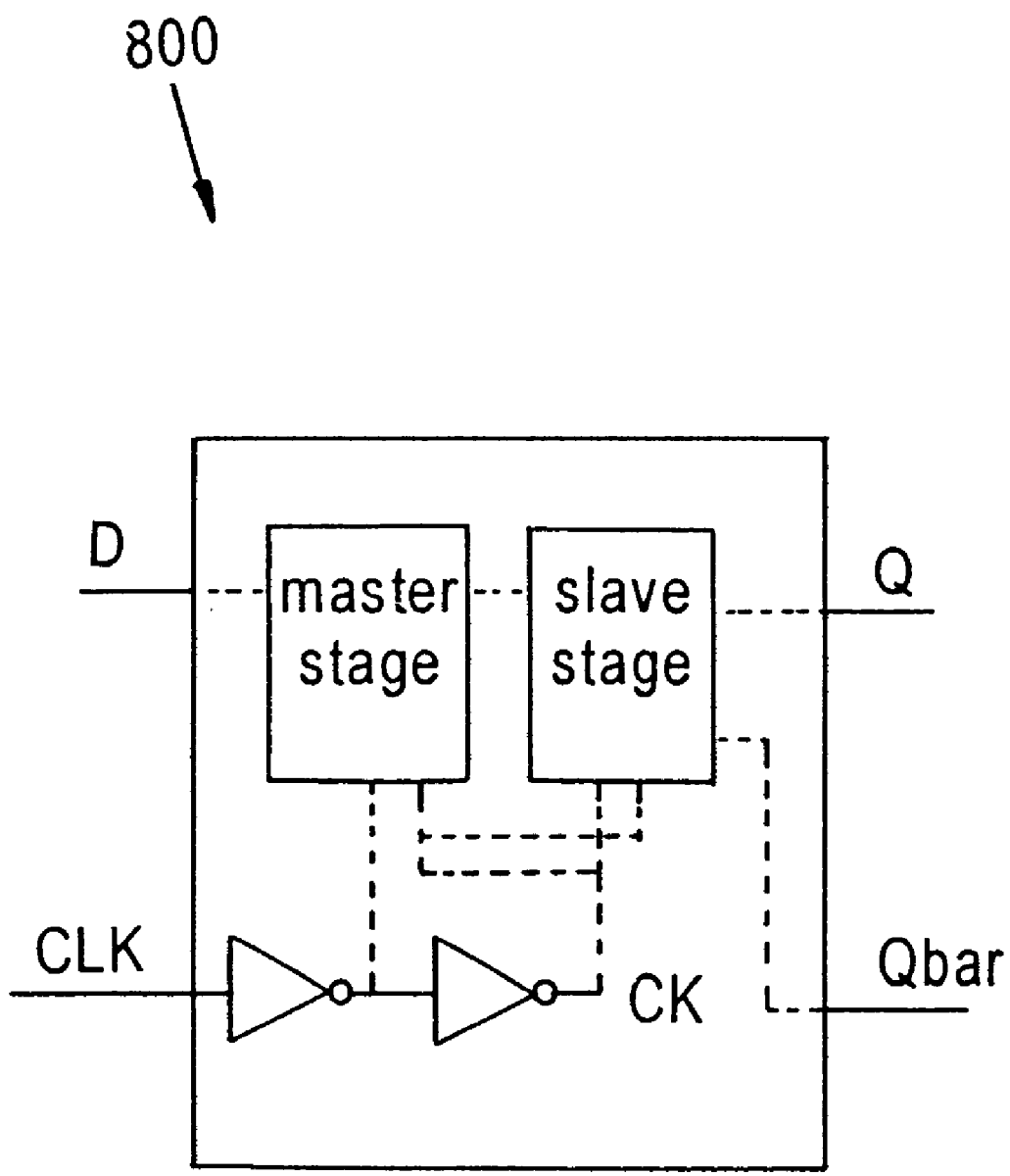
FIG. 8 illustrates a conventional flip-flop.

FIG. 8 illustrates a "D" type flip-flop 800 having an input "D", a clocked input "CLK" and two outputs "Q" and "Qbar". The internal clock of flip-flop 800 is designated "CK". According to an embodiment, the I/O path delays for flip-flops, namely "CLK" to "Q" or "CLK" to "Qbar", are divided into two portions: (1) "CLK" to "CK" delay; and (2) "CK" to "Q" delay or "CK" to "Qbar" delay. The "CLK" to "CK" delay is represented in hot carrier timing library data 106 as a table of I/O path delays (tpdx in FIG. 3B). Other parameters such as Idsat table values, Vdsat table values and input slew time (ts) table values are not considered for this portion of the delay. The switching number of clock is used for the aged delay interpolation. The "CK" to "Q" delay or the "CK" to "Qbar" delay contain all the delay model parameters including: I/O path delays (tpdx), Idsat table values, Vdsat table values and input slew time table values. The switching number of the output pin is used for aged delay interpolation. The I/O path delays (tpd) for "CLK" to "Q" and "CLK" to "Qbar" are determined as follows:

$$tpd(\text{``}CLK\text{''} \text{ to } \text{``}Q\text{''}) = \frac{tpd(\text{``}CLK\text{''} \text{ to } \text{``}CK\text{''})}{\underset{tabl\_of\_tpdx}{\uparrow}} + \frac{tpd(\text{``}CLK\text{''} \text{ to } \text{``}Q\text{''})}{\underset{table\_of\_tpdx, Idsat, Vdsat}{\uparrow}} \quad (5)$$

$$tpd(\text{``}CLK\text{''} \text{ to } \text{``}Qbar\text{''}) = \frac{tpd(\text{``}CLK\text{''} \text{ to } \text{``}CK\text{''})}{\underset{tabl\_of\_tpdx}{\uparrow}} + \frac{tpd(\text{``}CK\text{''} \text{ to } \text{``}Qbar\text{''})}{\underset{table\_of\_tpdx, Idsat, Vdsat}{\uparrow}} \quad (6)$$

In step 606, the aged input slew time for each instance is updated for each cell based upon the delays associated with any driving stages for the cells. In step 608, the fresh delay data is determined for each cell by an internal or external delay calculator 222. In step 610 the scaled delay data for each instance and/or hot carrier primitive is determined by the internal or external delay calculator 222 based upon the aged delay and switching activity data 224 to reflect any performance degradation in the cell instance and/or hot carrier primitive attributable to hot carrier effects.

In step 612 ratios of aged delay to fresh delay are determined for each instance. A particular delay ratio is determined as follows:

$$Delay\_Ratio = \frac{aged\_delay}{fresh\_delay} \quad (7)$$

In some CMOS logic circuits, transistors are connected in series. In these situations, the degradation associated with the transistors in series can affect delay paths that depend upon these transistors. Characterizing the combined delay degradation for these paths can require significant computing resources. To improve simulation speeds, the hot carrier simulation tool described herein uses a special model to determine the hot carrier effects on transistors connected in series.

Figure 9A:
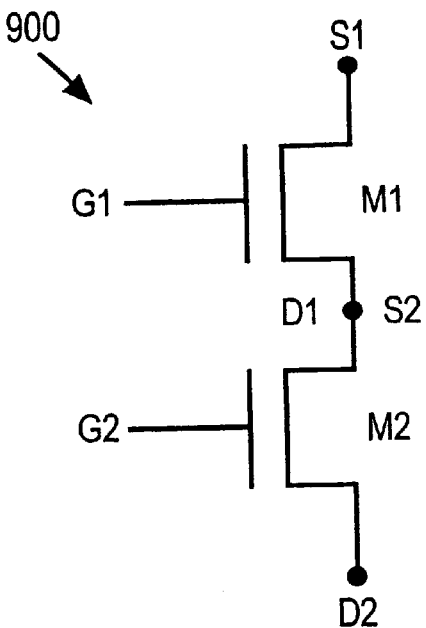
FIG. 9A illustrates a conventional transistor arrangement that includes two transistors connected in series.

According to one embodiment, a series resistor model is used for determining the hot carrier effects of two transistors connected in series because of the computational resources required to determine the hot carrier effects for two transistors connected in series. FIG. 9A illustrates a transistor arrangement 900 that includes two transistors, identified as "M1" and "M2" connected in series. Transistor "M1" has a source "S1", a gate "G1" and a drain "D1". Transistor "M2" has a source "S2", a gate "G2" and a drain "D2". The drain "D1" of transistor "M1" is connected to the source "S2" of transistor "M2". Determining the hot carrier effects of transistor arrangement 900 can require a significant amount of computational resources because the hot carrier effects of transistors "M1" and "M2" are not mutually exclusive and depend upon each other. Therefore, according to one embodiment, a series resistor model is used to determine the hot carrier effects for two transistors connected in series.

Figure 9B:
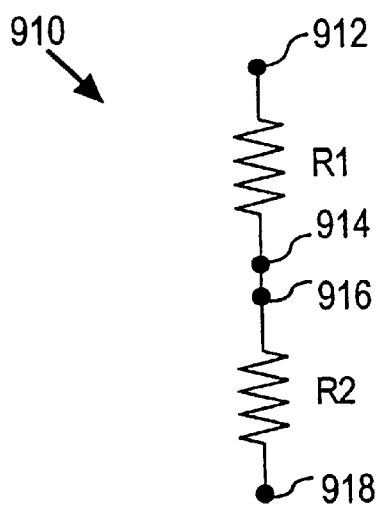
FIG. 9B illustrates a series resistor model for determining the hot carrier effects on transistors connected in series according to an embodiment.

FIG. 9B illustrates a series resistor arrangement 910 model for determining the hot carrier effects for two transistors connected in series according to one embodiment. Resistor arrangement 910 includes two resistors, identified as "R1" and "R2" connected in series. Resistor "R1" includes two terminals 912 and 914. Resistor "R2" includes two terminals 916 and 918. Terminal 914 is connected to terminal 916.

The following definitions and equations are used for determining the hot carrier effects on transistors connected in series:

(8) Definitions:
α1: Ratio of aged delay to fresh delay when only transistor "M1" has degradation
α2: Ratio of aged delay to fresh delay when only transistor "M2" has degradation
β1: Ratio of aged resistance to fresh resistance when only transistor "M1" has degradation
β2: Ratio of aged resistance to fresh resistance when only transistor "M2"has degradation
α: Ratio of aged delay to fresh delay when both transistors "M1" and "M2" have degradation The values for 1, 2 and are determined by the following equations:

$$\alpha 1 = \frac{\beta 1 * R1 + R2}{R1 + R2} \quad (9)$$

$$\alpha 2 = \frac{R1 + \beta 2 * R2}{R1 + R2} \quad (10)$$

$$\alpha = \frac{\beta 1 * R1 + \beta 2 * R2}{R1 + R2} = \alpha 1 + \alpha 2 - 1 \quad (11)$$

Figure 9C:
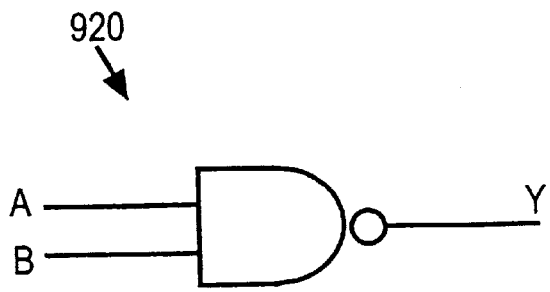
FIG. 9C illustrates a conventional two-input logical NAND gate.

These equations are used to determine the hot carrier effects for logic gates containing transistors connected in series. FIG. 9C illustrates a logical NAND gate 920. NAND gate 920 has two inputs, identified as "A" and "B" and one output identified as "Y". The operation of NAND gates is well known in the art. The hot carrier effects for both delay paths of NAND gate 920, that is both the delay from input "A" to output "Y" and the delay from input "B" to output "Y", is characterized by the following equation:

$$\alpha_{final} = \alpha_{B \text{ to } Y} + \alpha_{A \text{ to } Y} - 1 \quad (12)$$

In some situations the value of $\alpha_{final}$ overestimates the performance degradation attributable to hot carrier effects on transistors connected in series. Therefore, according to another embodiment, another set of equations is used to determine the hot carrier effects on transistors connected in series as follows:

For delay path of "B" to "Y": (13)

$$\alpha_{(B\ to\ Y)final} = \alpha_{B\ to\ Y} + (\alpha_{A\ to\ Y} - 1)*K$$

For delay path of "A" to "Y": (14)

$$\alpha_{(A\ to\ Y)final} = \alpha_{A\ to\ Y} + (\alpha_{B\ to\ Y} - 1)*K$$

A fitting parameter "K", typically having a value of between 0 and 1, is used to improve the accuracy of equation (12). Fitting parameter "K" is determined by measuring the combined degradation of two transistors in series and using the separately determined α1 and α2 to calculate "K".

This result is generalized to any number of series connected transistors. Assuming "n" transistors are in series connection, with input pin names $A_1, A_2, \ldots A_i, \ldots A_n$, and output pin name Y.

For a delay path of "$A_i$" to "$Y_i$": (15)

$$\alpha_{(A_i\ to\ Y)final} = \alpha_{A_i\ to\ Y} + \left(\sum_{j=1; j \neq i}^{n} \alpha_{j\ to\ Y} - (n-1)\right) * K$$

Returning to FIG. 6, in step 614 unscaled timing data 108 (FIG. 1) for each instance is read from input timing files. The unscaled timing files may be provided by a user or may be predetermined files. According to one embodiment, the data contained in the unscaled timing files is in standard delay format (SDF), a file format developed by Cadence Design Systems, Inc. of San Jose, Calif.

In step 616 unscaled timing data 108 is scaled using the aged delay to fresh delay ratios to determine instance delays attributable to hot carrier effects. In step 618 the scaled timing data is written to a set of aged timing files, which in step 620, can be used by a logic simulator or a timing analyzer to simulate the hot carrier effects on the entire IC represented by the cell instances. The process is complete in step 622.

Figure 11:
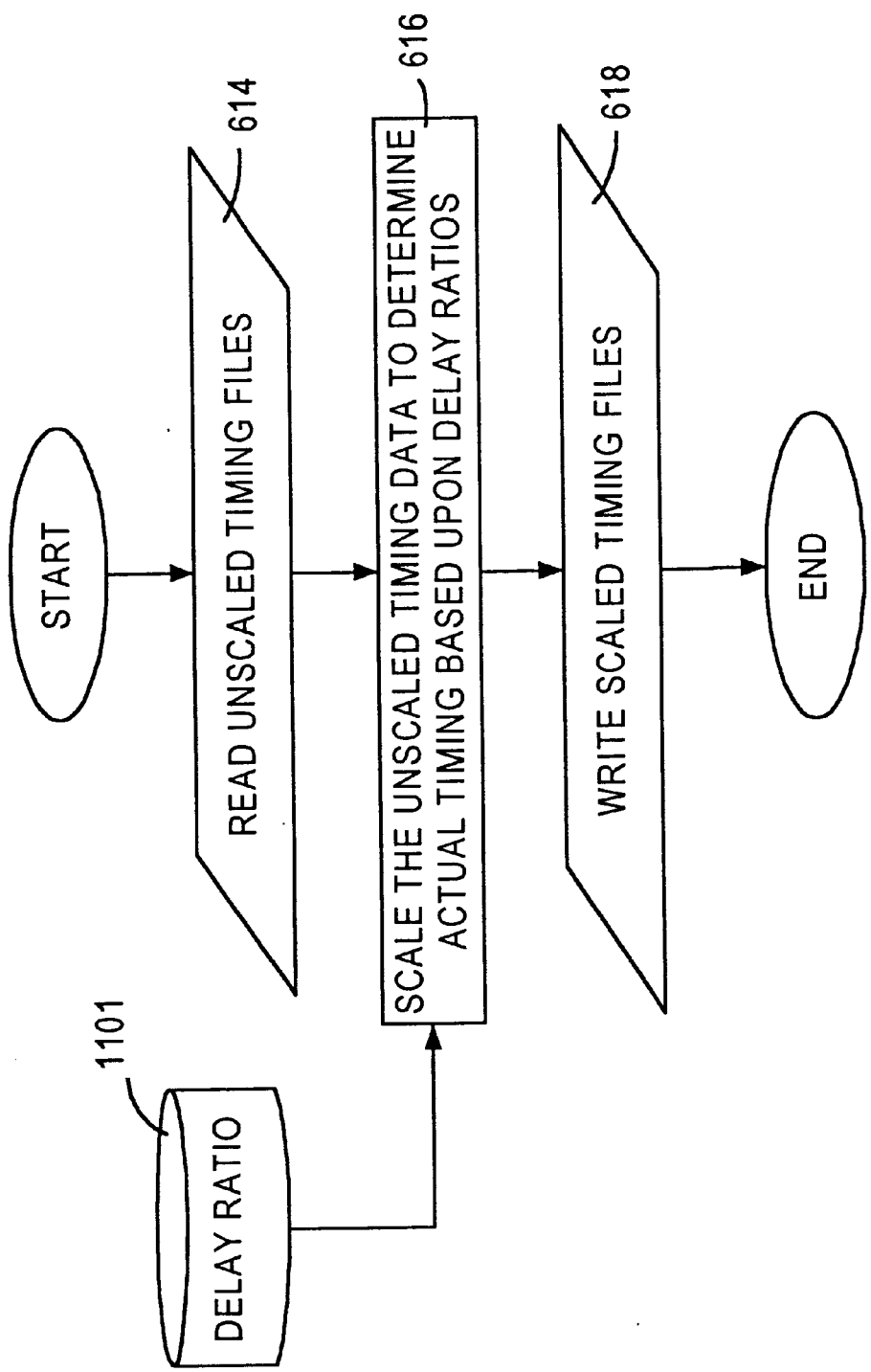
FIG. 11 is a flow chart illustrating another example of the a method for simulating hot carrier effects of an integrated circuit using data contained in a hot carrier library generated according to the method of FIG. 6.

The flow chart of FIG. 11 shows another example of FIG. 6. In step 616, unscaled timing data is multiplied by the delay ratio 1101 to generate scaled timing data The delay ratio 1101 in FIG. 11 may arbitrarily be prepared in advance. Therefore, the user can estimate the hot carrier effect on the target IC by simply setting the expected delay ratio values in the delay ratio file 1101.

Figure 12:
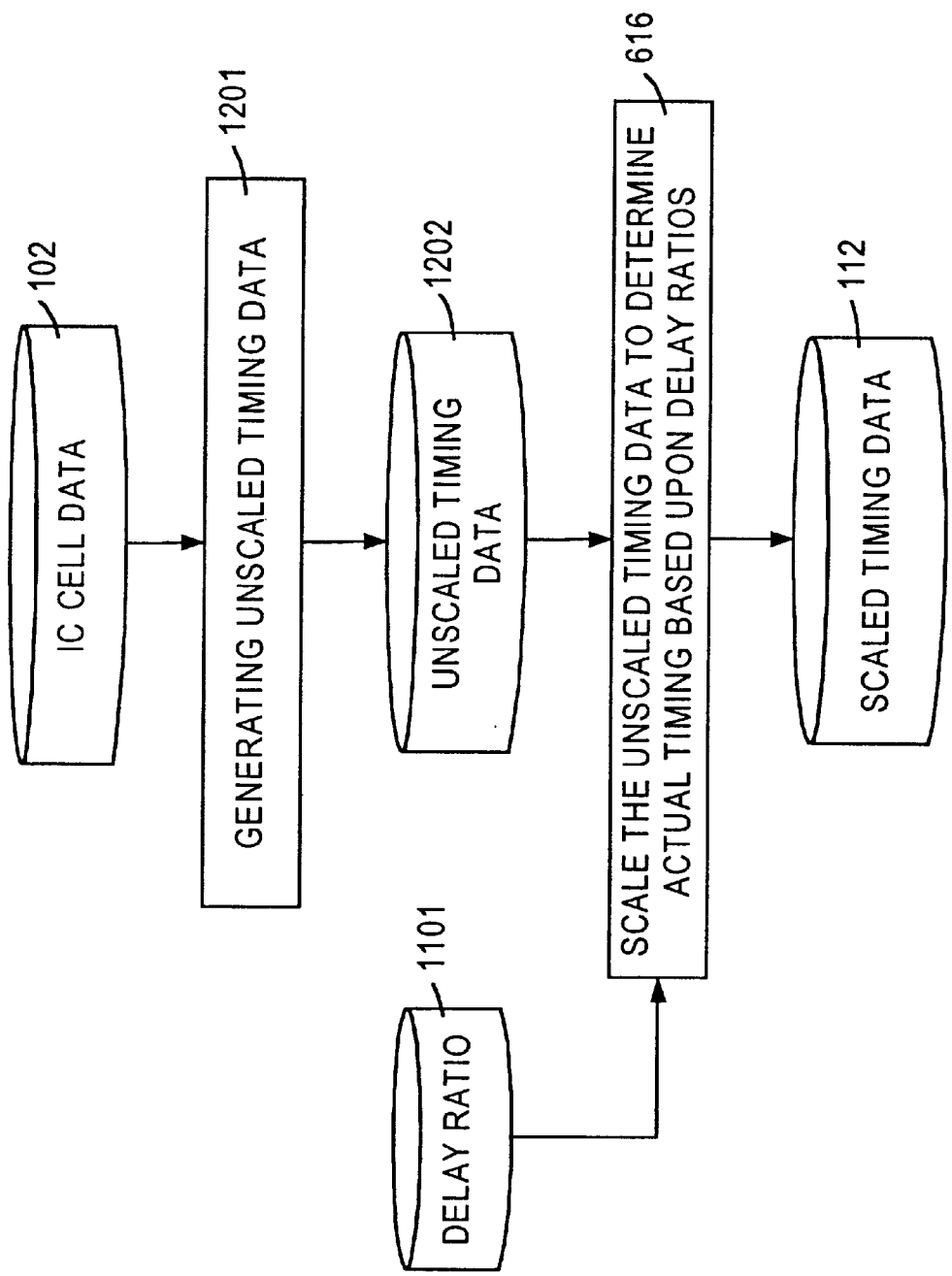
FIG. 12 is a flow chart that further explains FIG. 11 in more detail.

FIG. 12 further explains FIG. 11 in more detail. Step 1201 outputs unscaled timing data 1202 based on IC cell data 102 without hot carrier effect at this moment. Next, step 616 multiplies unscaled timing data 1202 with delay ratio 1101 and finally outputs scaled timing data 112. Back to FIG. 11, step 618 writes this scaled timing data 112 into scaled timing files.

Figure 13:
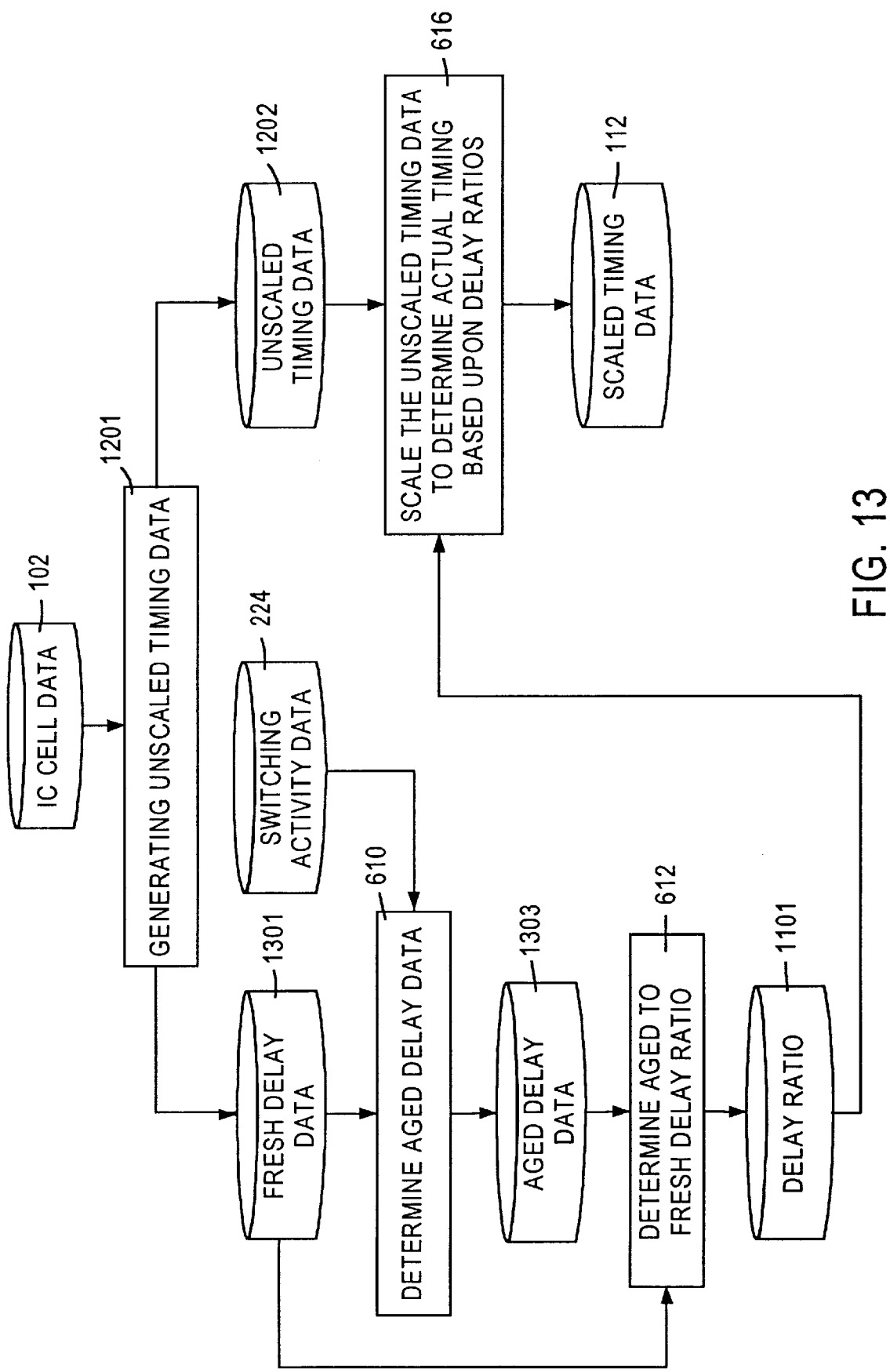
FIG. 13 is a flow chart that further describes the latter half steps of FIG. 6.

FIG. 13 further describes the latter half steps of FIG. 6. Step 1201 including steps 602 to 608 of FIG. 6 calculates and outputs both fresh delay data 1301 and unscaled timing data 1202. In fresh delay data 1301, delay data is described at primitive level. Next step 610 outputs aged delay data 1303 according to fresh delay data 1301 and switching activity data 224 from the logic simulator. Step 612 calculates hot carrier effect on the degree of delay degradation at primitive level and synthesize such degree of each instance based on delay data at primitive level. Step 612 then outputs determined degree as delay ratio 1101 at instance level. Step 616 generates scaled timing data 112 by simply multiplying delay ratio 1101 and unscaled timing data 1202 at instance level.

It is necessary to have the same delay values between unscaled timing data 1202 and scaled timing data 112 if a delay ratio is given to one. Such consistency can be maintained in this unique scaling scheme as said in this embodiment. Even a different delay calculator can be used in generating fresh delay data 1301 and unscaled timing data 1202. Therefore IC designers can enjoy high flexibility of CAD tool choice in for example selecting sing-off tool.

C. Implementation Mechanisms

The approach for simulating hot carrier effects in an IC described herein may be implemented as one or more computer-executed instructions, processes, programs, subroutines, functions, routines, or their equivalents. For example, in one embodiment, the approach for simulating hot carrier effects on an IC is implemented by a computer program containing one or more sequences of one or more instructions executing on a general purpose computer. Appendix A contains a user's manual for a computer program known as "Glacier" by BTA Technology Inc. of Santa Clara, Calif. Alternatively, the approach for simulating hot carrier effects in an IC as described herein may be implemented by discrete hardware circuitry. Thus, embodiments of the invention may be implemented in computer software, discrete hardware circuitry, or a combination of both computer software and discrete hardware circuitry.

D. Hardware Overview

Figure 10:
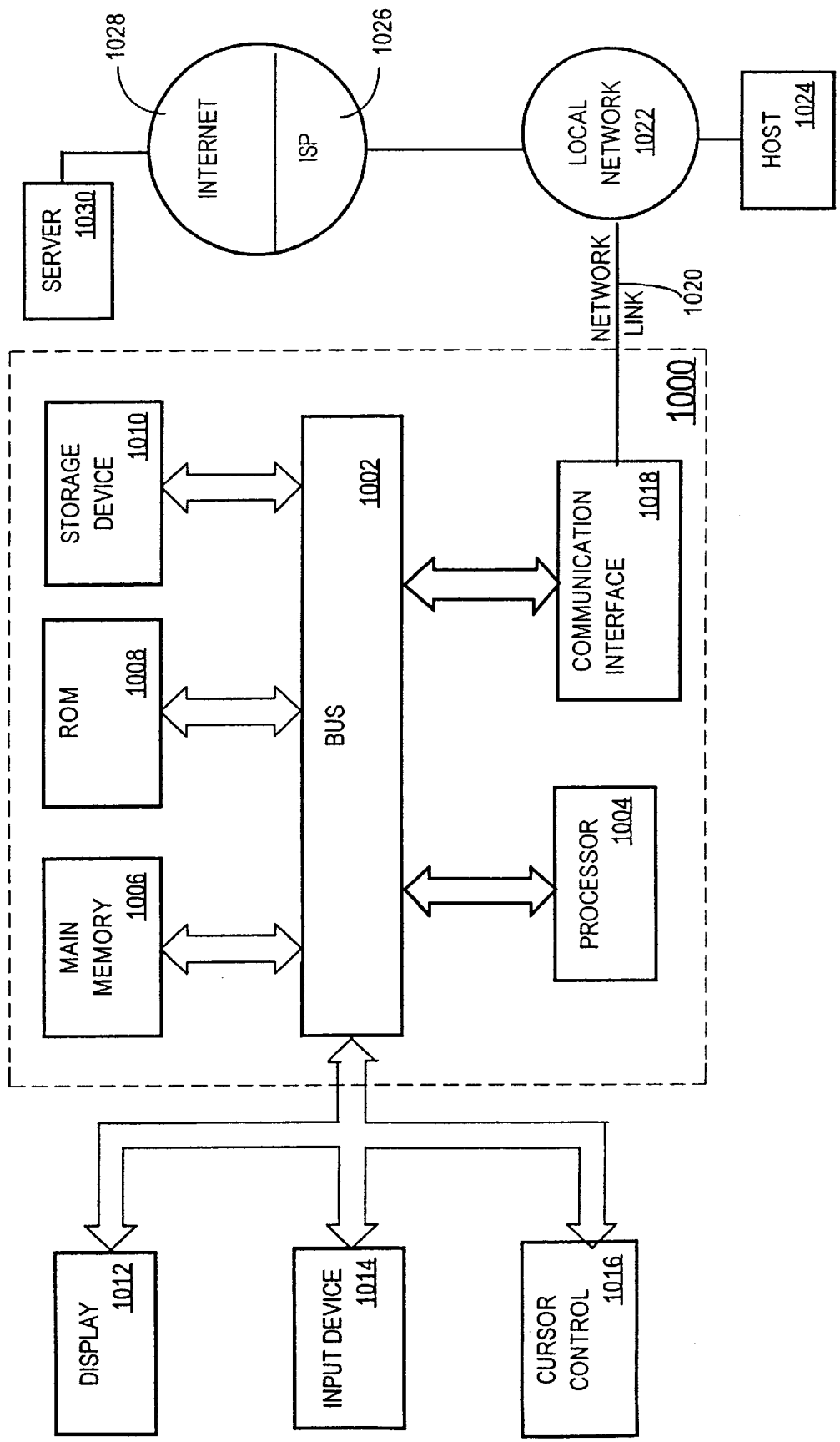
FIG. 10 is a block diagram of a computer system on which embodiments may be implemented.

FIG. 10 is a block diagram that illustrates a computer system 1000 upon which an embodiment of the invention may be implemented. Computer system 1000 includes a bus 1002 or other communication mechanism for communicating information, and a processor 1004 coupled with bus 1002 for processing information. Computer system 1000 also includes a main memory 1006, such as a random access memory (RAM) or other dynamic storage device, coupled to bus 1002 for storing information and instructions to be executed by processor 1004. Main memory 1006 also may be used for storing temporary variables or other intermediate information during execution of instructions to be executed by processor 1004. Computer system 1000 further includes a read only memory (ROM) 1008 or other static storage device coupled to bus 1002 for storing static information and instructions for processor 1004. A storage device 1010, such as a magnetic disk or optical disk, is provided and coupled to bus 1002 for storing information and instructions.

Computer system 1000 may be coupled via bus 1002 to a display 1012, such as a cathode ray tube (CRT), for displaying information to a computer user. An input device 1014, including alphanumeric and other keys, is coupled to bus 1002 for communicating information and command selections to processor 1004. Another type of user input device is cursor control 1016, such as a mouse, a trackball, or cursor direction keys for communicating direction information and command selections to processor 1004 and for controlling cursor movement on display 1012. This input device typically has two degrees of freedom in two axes, a first axis (e.g., x) and a second axis (e.g., y), that allows the device to specify positions in a plane.

The invention is related to the use of computer system 1000 for simulating hot carrier effects on an IC. According to one embodiment of the invention, the simulation of hot carrier effects on an IC is provided by computer system 1000 in response to processor 1004 executing one or more sequences of one or more instructions contained in main memory 1006. Such instructions may be read into main memory 1006 from another computer-readable medium, such as storage device 1010. Execution of the sequences of instructions contained in main memory 1006 causes processor 1004 to perform the process steps described herein. One or more processors in a multi-processing arrangement may also be employed to execute the sequences of instructions contained in main memory 1006. In alternative embodiments, bard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 1004 for execution. Such a medium may take many forms, including but not limited to, non-volatile media, volatile media, and transmission media. Non-volatile media includes, for example, optical or magnetic disks, such as storage device 1010. Volatile media includes dynamic memory, such as main memory 1006. Transmission media includes coaxial cables, copper wire and fiber optics, including the wires that comprise bus 1002. Transmission media can also take the form of acoustic or light waves, such as those generated during radio wave and infrared data communications.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 1004 for execution. For example, the instructions may initially be carried on a magnetic disk of a remote computer. The remote computer can load the instructions into its dynamic memory and send the instructions over a telephone line using a modem. A modem local to computer system 1000 can receive the data on the telephone line and use an infrared transmitter to convert the data to an infrared signal. An infrared detector coupled to bus 1002 can receive the data carried in the infrared signal and place the data on bus 1002. Bus 1002 carries the data to main memory 1006, from which processor 1004 retrieves and executes the instructions. The instructions received by main memory 1006 may optionally be stored on storage device 1010 either before or after execution by processor 1004.

Computer system 1000 also includes a communication interface 1018 coupled to bus 1002. Communication interface 1018 provides a two-way data communication coupling to a network link 1020 that is connected to a local network 1022. For example, communication interface 1018 may be an integrated services digital network (ISDN) card or a modem to provide a data communication connection to a corresponding type of telephone line. As another example, communication interface 1018 may be a local area network (LAN) card to provide a data communication connection to a compatible LAN. Wireless links may also be implemented. In any such implementation, communication interface 1018 sends and receives electrical, electromagnetic or optical signals that carry digital data streams representing various types of information.

Network link 1020 typically provides data communication through one or more networks to other data devices. For example, network link 1020 may provide a connection through local network 1022 to a host computer 1024 or to data equipment operated by an Internet Service Provider (ISP) 1026. ISP 1026 in turn provides data communication services through the world wide packet data communication network now commonly referred to as the "Internet" 1028. Local network 1022 and Internet 1028 both use electrical, electromagnetic or optical signals that carry digital data streams. The signals through the various networks and the signals on network link 1020 and through communication interface 1018, which carry the digital data to and from computer system 1000, are exemplary forms of carrier waves transporting the information.

Computer system 1000 can send messages and receive data, including program code, through the network(s), network link 1020 and communication interface 1018. In the Internet example, a server 1030 might transmit a requested code for an application program through Internet 1028, ISP 1026, local network 1022 and communication interface 1018. In accordance with the invention, one such downloaded application provides for simulating hot carrier effects in an IC as described herein.

The received code may be executed by processor 1004 as it is received, and/or stored in storage device 1010, or other non-volatile storage for later execution. In this manner, computer system 1000 may obtain application code in the form of a carrier wave.

The techniques described herein provide several advantages over prior approaches for simulating performance degradation in an IC attributable to hot carrier effects. First, the approach described herein provide a more accurate simulation of performance degradation attributable to hot carrier effects on an entire IC because each cell in an IC is separately characterized. Specifically, the time-based hot carrier effects for each instance of each cell is separately determined to more accurately characterize the performance degradation attributable to hot carrier effects. Complex cell instances are decomposed into hot carrier primitives to provide a more accurate characterization of hot carrier effects. In addition, the switching activity of each instance is evaluated over a specified time so that the switching activity of each cell instance can be determined for particular ages. This provides a more accurate assessment of performance degradation attributable to hot carrier effects.

The approach described herein allows ICs having a relatively large number of devices to be simulated. In addition, the approach described herein provides a performance advantage over prior approaches because once the hot carrier timing library data has been generated, the data contained in the hot carrier timing library data can be reused which significantly reduces the amount of computational resources required to simulate the hot carrier effects for an entire IC. This allows designers to simulate a large number of solutions and determine the "best" solution with relatively few computational resources.

In the foregoing specification, the invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method for simulating hot carrier effects in an integrated circuit (IC) that contains a plurality of semiconductor devices, the method comprising the steps of:

receiving IC cell data that specifies a set of one or more cells in the IC, each cell containing one or more of the plurality of semiconductor devices;

generating delay data and unscaled timing data of the set of one or more cells;

generating, based upon the delay data and switching activity of each cell, aged delay data that reflects time-based performance degradation of time delays for the set of one or more cells; and generating, based upon unscaled timing data that specifies timing delays associated with the set of one or more cells, scaled timing data by scaling the unscaled timing data with a delay ratio, wherein said delay data and said aged delay data are used to determine said delay ratio.

2. The method of claim 1, further including the step of processing the scaled timing data with a logic simulator.

3. The method of claim 1, further including the step of processing the scaled timing data with a timing analyzer to provide a timing analysis.

4. The method of claim 1, wherein the step of generating aged delay data includes the step of, for each cell in the set of one or more cells, determining performance degradation of each semiconductor device contained in each cell at different cell ages.

5. The method of claim 4, further including the steps of, for each cell in the set of one or more cells, determining a set of stimulus patterns, wherein each stimulus pattern represents a particular change in one or more cell outputs based upon a change in one or more cell inputs, and determining the time-based performance degradation of the cell attributable to hot carrier effects for the set of stimulus patterns.

6. The method of claim 4, wherein the step of generating aged delay data involves using a circuit reliability simulator to determine the performance degradation of each semiconductor device contained in each cell at different cell ages.

7. The method of claim 1, wherein the method further includes the steps of, for each cell in the set of one or more cells receiving an input slew time, receiving an output load capacitance, and receiving age information specifying a set of one or more time intervals over which the performance degradation attributable to hot carrier effects is to be evaluated; and wherein the step of generating aged delay data includes the step of generating aged delay data based upon the input slew time, the output load capacitance and the age information.

8. The method of claim 1, further including the step of determining the switching activity for the set of one or more cells by performing a logic simulation of the set of one or more cells over a predetermined period of time and measuring the number of times outputs of the set of one or more cells change state during the predetermined period of time.

9. The method of claim 8, wherein the step of generating aged delay data involves using the delay data and the number of times that outputs of the set of one or more cells change state during the predetermined time period.

10. The method of claim 8, further including the step of decomposing a particular cell in the set of one or more cells that contains combinational logic into constituent parts and determining the switching activity for each of the constituent parts separately.

11. The method of claim 1, wherein the step of generating aged delay data includes the step of generating a set of delay ratios for each cell, each delay ratio representing a ratio of an aged delay to a fresh delay for a particular cell.

12. The method of claim 1, further including the step of applying the sets of delay ratios to the unscaled timing data to generate the scaled timing data.

13. The method of claim 12, further including the step of generating a driving source table for each cell containing delay data based upon input slew times and output load capacitances.

14. The method of claim 1, wherein the step of generating delay data is performed using a source table delay model to characterize a driving capability of a cell based upon a plurality of input slew times and output load capacitances, the source table delay model being based upon I/O path delays and interconnect delays associated with a cell.

15. The method of claim 1, wherein the IC cell data includes device model data and the method further includes the step of generating aged device model data based upon the device model data and the delay data.

16. A computer-readable medium carrying instructions for simulating hot carrier effects in an integrated circuit (IC) that contains a plurality of semiconductor devices, the instructions including instructions which, when executed by one or more processors, cause the one or more processors to perform the steps of:

receiving IC cell data that specifies a set of one or more cells in the IC, each cell containing one or more of the plurality of semiconductor devices;

generating delay data and unscaled timing data of the set of one or more cells;

generating, based upon the delay data and switching activity of each cell, aged delay data that reflects time-based performance degradation of time delays for the set of one or more cells; and generating, based upon unscaled timing data that specifies timing delays associated with the set of one or more cells, scaled timing data by scaling the unscaled timing data with a delay ratio, wherein said delay data and said aged delay data are used to determine said delay ratio.

17. The computer-readable medium of claim 16, further including instructions for performing the step of processing the scaled timing data with a logic simulator.

18. The computer-readable medium of claim 16, further including instructions for performing the step of processing the scaled timing data with a timing analyzer to provide a timing analysis.

19. The computer-readable medium of claim 16, wherein the step of generating aged delay data includes the step of for each cell in the set of one or more cells, determining performance degradation of each semiconductor device contained in each cell at different cell ages.

20. The computer-readable medium of claim 19, further including instructions for performing the steps of, for each cell in the set of one or more cells, determining a set of stimulus patterns, wherein each stimulus pattern represents a particular change in one or more cell outputs based upon a change in one or more cell inputs, and determining the time-based performance degradation of the cell attributable to hot carrier effects for the set of stimulus patterns.

21. The computer-readable medium of claim 19, wherein the step of generating aged delay data involves using a circuit reliability simulator to determine the performance degradation of each semiconductor device contained in each cell at different cell ages.

22. The computer-readable medium of claim 16, further including instructions for performing the steps of, for each cell in the set of one or more cells
receiving an input slew time,
receiving an output load capacitance, and
receiving age information specifying a set of one or more time intervals over which the performance degradation attributable to hot carrier effects is to be evaluated; and wherein
the step of generating aged delay data includes the step of generating aged delay data based upon the input slew time, the output load capacitance and the age information.

23. The computer-readable medium of claim 16, further including instructions for performing the step of determining the switching activity for the set of one or more cells by performing a logic simulation of the set of one or more cells over a predetermined period of time and measuring the number of times outputs of the set of one or more cells change state during the predetermined period of time.

24. The computer-readable medium of claim 23, wherein the step of generating aged delay data involves using the delay data and the number of times that outputs of the set of one or more cells change state during the predetermined time period.

25. The computer-readable medium of claim 23, further including instructions for performing the step of decomposing a particular cell in the set of one or more cells that contains combinational logic into constituent parts and determining the switching activity for each of the constituent parts separately.

26. The computer-readable medium of claim 16, wherein the step of generating aged delay data includes the step of generating a set of delay ratios for each cell, each delay ratio representing a ratio of an aged delay to a fresh delay for a particular cell.

27. The computer-readable medium of claim 16, further including instructions for performing the step of applying the sets of delay ratios to the unscaled timing data to generate the scaled timing data.

28. The computer-readable medium of claim 27, further including instructions for performing the step of generating a driving source table for each cell containing delay data based upon input slew times and output load capacitances.

29. The computer-readable medium of claim 16, wherein the step of generating delay data is performed using a source table delay model to characterize a driving capability of a cell based upon a plurality of input slew times and output load capacitances, the source table delay model being based upon I/O path delays and interconnect delays associated with a cell.

30. The computer-readable medium of claim 16, wherein the IC cell data includes device model data and the method further includes the step of generating aged device model data based upon the device model data and the delay data.

31. A computer system for simulating hot carrier effects in an integrated circuit (IC) that contains a plurality of semiconductor devices, the computer system comprising:
one or more processors; and
a memory communicatively coupled to the one or more processors and containing one or more sequences of instructions which, when executed by the one or more processors, cause the one or more processors to perform the steps of:
receiving IC cell data that specifies a set of one or more cells in the IC, each cell containing one or more of the plurality of semiconductor devices;
generating delay data and unscaled timing data of the set of one or more cells;
generating, based upon the delay data and switching activity of each cell, aged delay data that reflects time-based performance degradation of time delays for the set of one or more cells; and
generating, based upon unscaled timing data that specifies timing delays associated with the set of one or more cells, scaled timing data by scaling the unscaled timing data with a delay ratio, wherein
said delay data and said aged delay data are used to determine said delay ratio.

32. The computer system of claim 31, further including instructions for performing the step of processing the scaled timing data with a logic simulator.

33. The computer system of claim 31, further including instructions for performing the step of processing the scaled timing data with a timing analyzer to provide a timing analysis.

34. The computer system of claim 31, wherein the step of generating aged delay data includes the step of for each cell in the set of one or more cells, determining performance degradation of each semiconductor device contained in each cell at different cell ages.

35. The computer system of claim 34, further including instructions for performing the steps of, for each cell in the set of one or more cells,
determining a set of stimulus patterns, wherein each stimulus pattern represents a particular change in one or more cell outputs based upon a change in one or more cell inputs, and
determining the time-based performance degradation of the cell attributable to hot carrier effects for the set of stimulus patterns.

36. The computer system of claim 34, wherein the step of generating aged delay data involves using a circuit reliability simulator to determine the performance degradation of each semiconductor device contained in each cell at different cell ages.

37. The computer system of claim 31, further including instructions for performing the steps of, for each cell in the set of one or more cells
receiving an input slew time,
receiving an output load capacitance, and
receiving age information specifying a set of one or more time intervals over which the performance degradation attributable to hot carrier effects is to be evaluated; and wherein
the step of generating aged delay data includes the step of generating aged delay data based upon the input slew time, the output load capacitance and the age information.

38. The computer system of claim 31, further including instructions for performing the step of determining the switching activity for the set of one or more cells by performing a logic simulation of the set of one or more cells over a predetermined period of time and measuring the number of times outputs of the set of one or more cells change state during the predetermined period of time.

39. The computer system of claim 38, wherein the step of generating aged delay data involves using the delay data and the number of times that outputs of the set of one or more cells change state during the predetermined time period.

40. The computer system of claim 38, further including instructions for performing the step of decomposing a particular cell in the set of one or more cells that contains combinational logic into constituent parts and determining the switching activity for each of the constituent parts separately.

41. The computer system of claim 31, wherein the step of generating aged delay data includes the step of generating a set of delay ratios for each cell, each delay ratio representing a ratio of an aged delay to a fresh delay for a particular cell.

42. The computer system of claim 31, further including instructions for performing the step of applying the sets of delay ratios to the unscaled timing data to generate the scaled timing data.

43. The computer system of claim 42, further including instructions for performing the step of generating a driving source table for each cell containing delay data based upon input slew times and output load capacitances.

44. The computer system of claim 31, wherein the step of generating delay data is performed using a source table delay model to characterize a driving capability of a cell based upon a plurality of input slew times and output load capacitances, the source table delay model being based upon I/O path delays and interconnect delays associated with a cell.

45. The computer system of claim 31, wherein the IC cell data includes device model data and the method further includes the step of generating aged device model data based upon the device model data and the delay data.

46. A method for simulating hot carrier effects in an integrated circuit (IC) that contains a plurality of semiconductor devices, the method comprising the step of:

receiving IC cell data that specifies a set of one or more cells in the IC, each cell containing one or more of the plurality of semiconductor devices;

generating unscaled timing data for the set of one or more cells in the IC and fresh delay data, said fresh delay data being a delay time for primitive cells which define a particular cell of said one or more cells;

generating, based upon the fresh delay data and switching activity of each cell, aged delay data, said aged delay data reflecting time based performance degradation of the primitive cells;

generating delay ratios based upon the fresh delay data and the aged delay data of each primitive cell, and generating scaled timing data based upon both the delay ratio and the unscaled timing data.

* * * * *